(12) United States Patent
Liao

(10) Patent No.: US 7,746,694 B2
(45) Date of Patent: *Jun. 29, 2010

(54) NONVOLATILE MEMORY ARRAY HAVING MODIFIED CHANNEL REGION INTERFACE

(75) Inventor: Yi Ying Liao, Sijhih (TW)

(73) Assignee: Macronix International Co., Ltd., Hsinchu (TW)

( * ) Notice: Subject to any disclaimer, the term of this patent is extended or adjusted under 35 U.S.C. 154(b) by 289 days.

This patent is subject to a terminal disclaimer.

(21) Appl. No.: 11/775,107

(22) Filed: Jul. 9, 2007

(65) Prior Publication Data

US 2008/0031046 A1 Feb. 7, 2008

Related U.S. Application Data

(60) Provisional application No. 60/806,840, filed on Jul. 10, 2006.

(51) Int. Cl.
*G11C 16/04* (2006.01)
(52) U.S. Cl. .............................. 365/185.05; 365/185.28
(58) Field of Classification Search ............ 365/185.05, 365/185.28
See application file for complete search history.

(56) References Cited

U.S. PATENT DOCUMENTS

| 4,115,914 | A * | 9/1978 | Harari | ......................... 438/157 |
|---|---|---|---|---|
| 6,255,166 | B1 * | 7/2001 | Ogura et al. | ............ 365/185.27 |
| 7,084,454 | B2 * | 8/2006 | Pinnow et al. | ............... 365/182 |
| 7,514,742 | B2 * | 4/2009 | Yeh et al. | ...................... 257/326 |
| 2006/0258090 | A1 | 11/2006 | Bhattacharyya et al. | |
| 2006/0261401 | A1 | 11/2006 | Bhattacharyya | |
| 2007/0012988 | A1 | 1/2007 | Bhattacharyya | |
| 2009/0189202 | A1 * | 7/2009 | Baptiste | ....................... 257/288 |

OTHER PUBLICATIONS

Yeh, Chih-Chieh et al., A Novel PHINES Flash Memory Cell with Low Power Program/Erase, Small Pitch, Two-Bits-Per-Cell for Data Storage Applications, IEEE Transactions on Electron Devices, Vil. 52, No. 4, Apr. 2005, pp. 541-546.

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

Sim, Sang-Pil, "Fully Dimensional NOR Flash Cell with Recessed Channel and Cylindrical Floating Gate-A Scaling Direction for 65nm and Beyond," 2006 Symposium on VLSI technology Digest of Technical Papers, 2006 IEEE, 2 pp.

* cited by examiner

*Primary Examiner*—Tuan T. Nguyen
(74) *Attorney, Agent, or Firm*—Kenta Suzue; Haynes Beffel & Wolfeld LLP

(57) ABSTRACT

The technology relates to nonvolatile memory with a modified channel region interface, such as a raised source and drain or a recessed channel region.

15 Claims, 32 Drawing Sheets

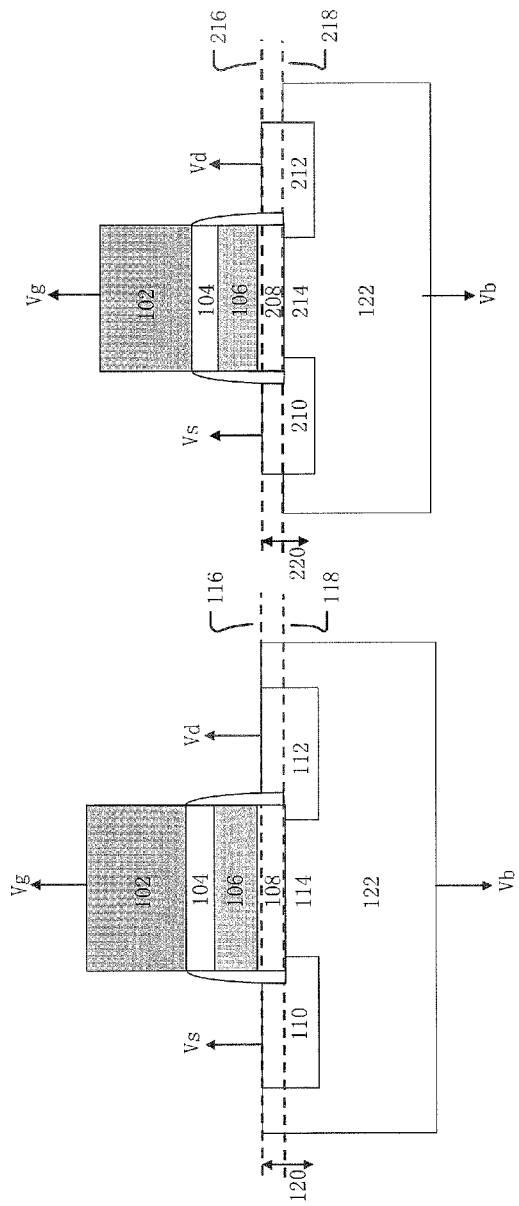

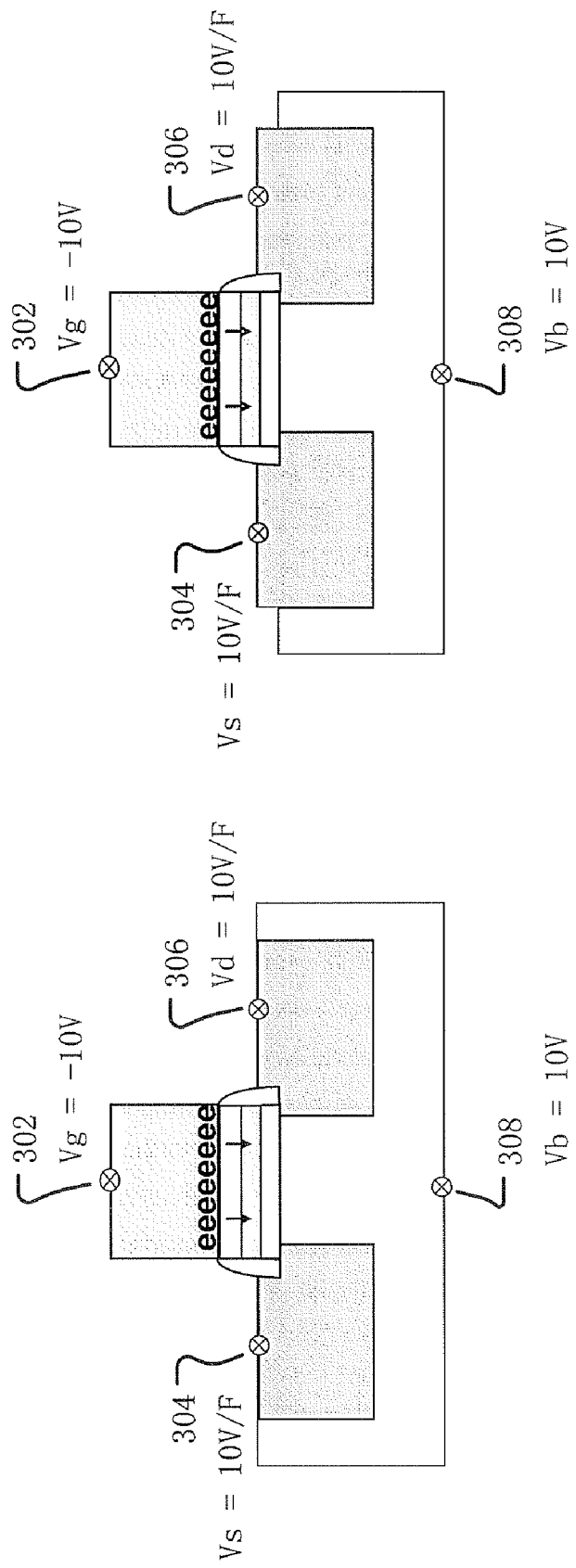

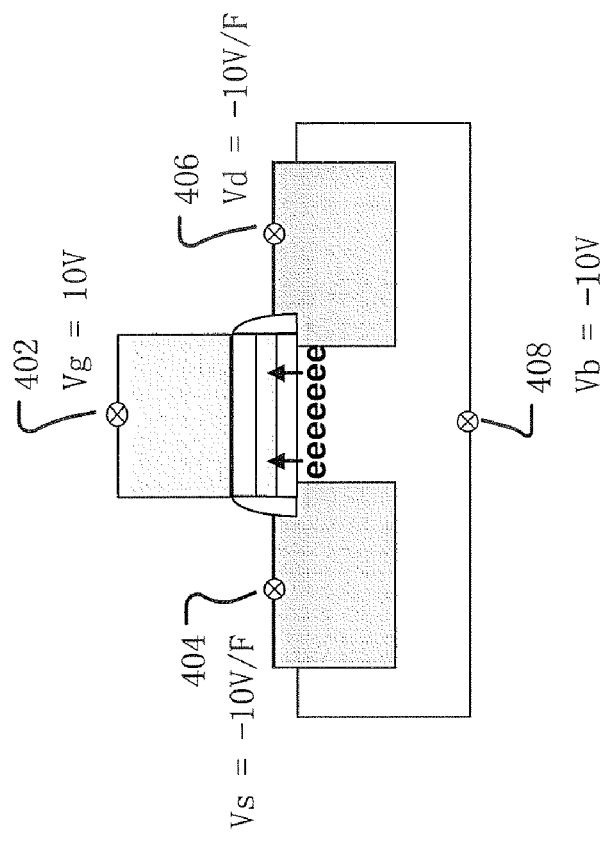
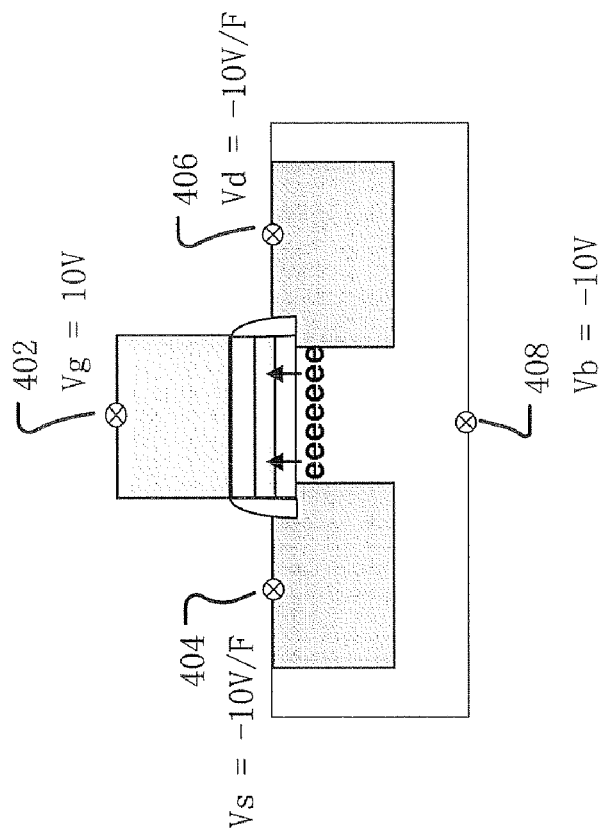

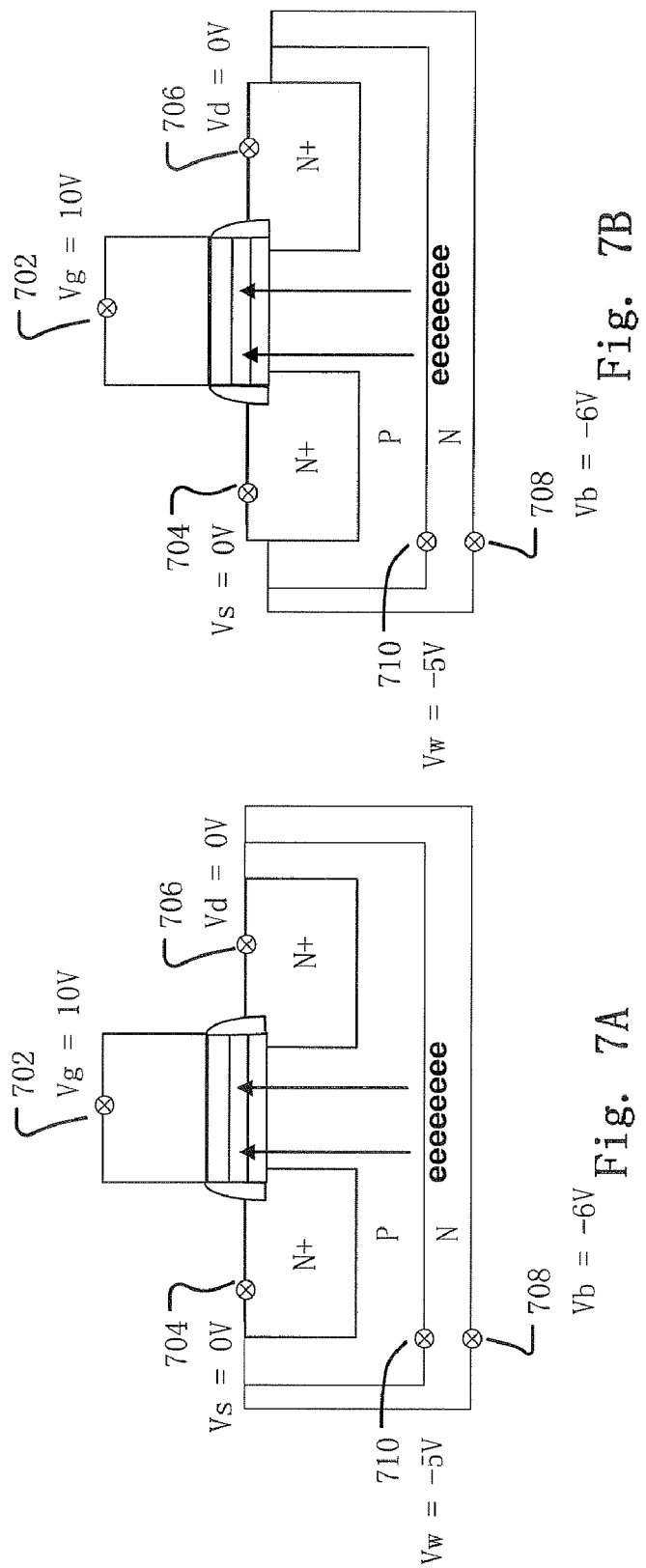

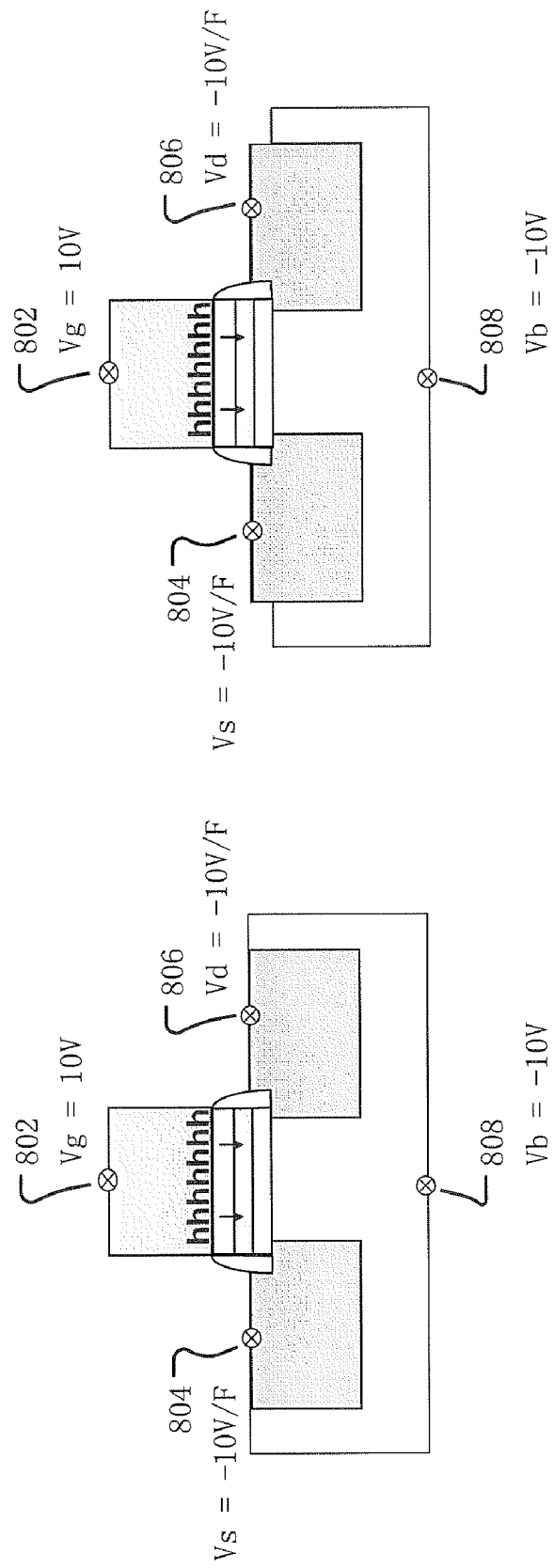

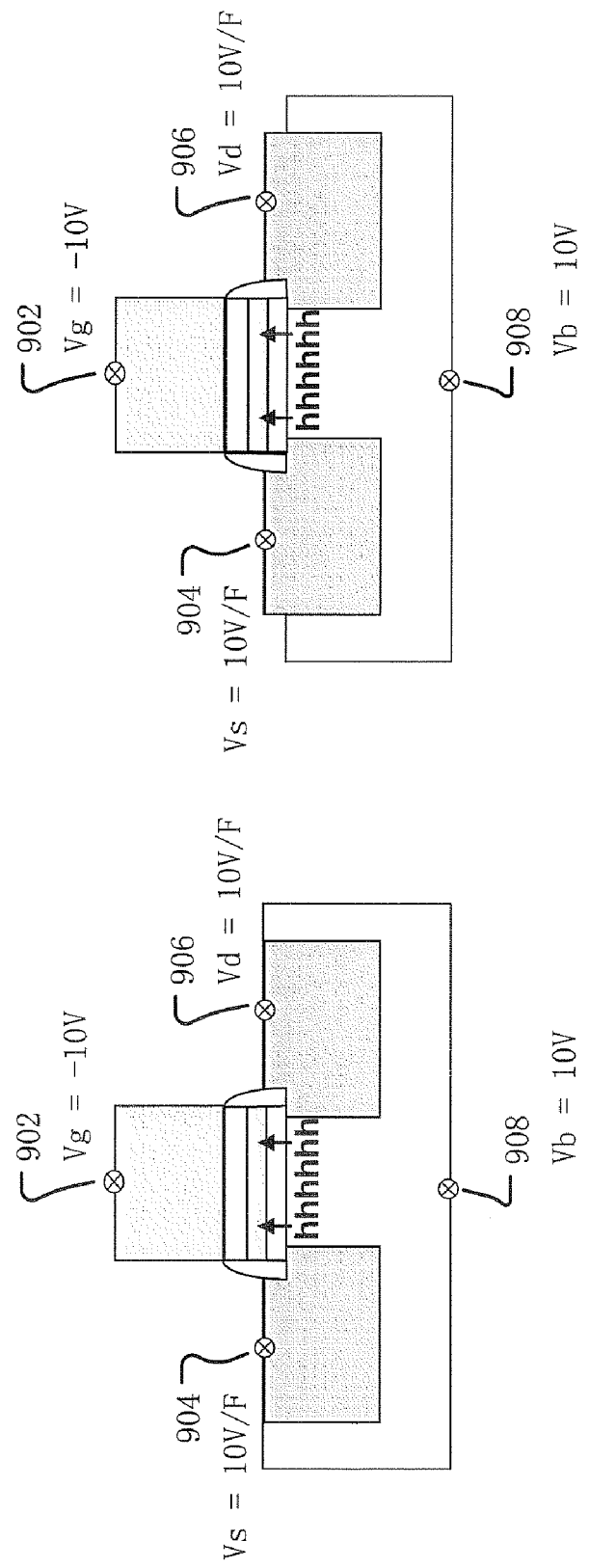

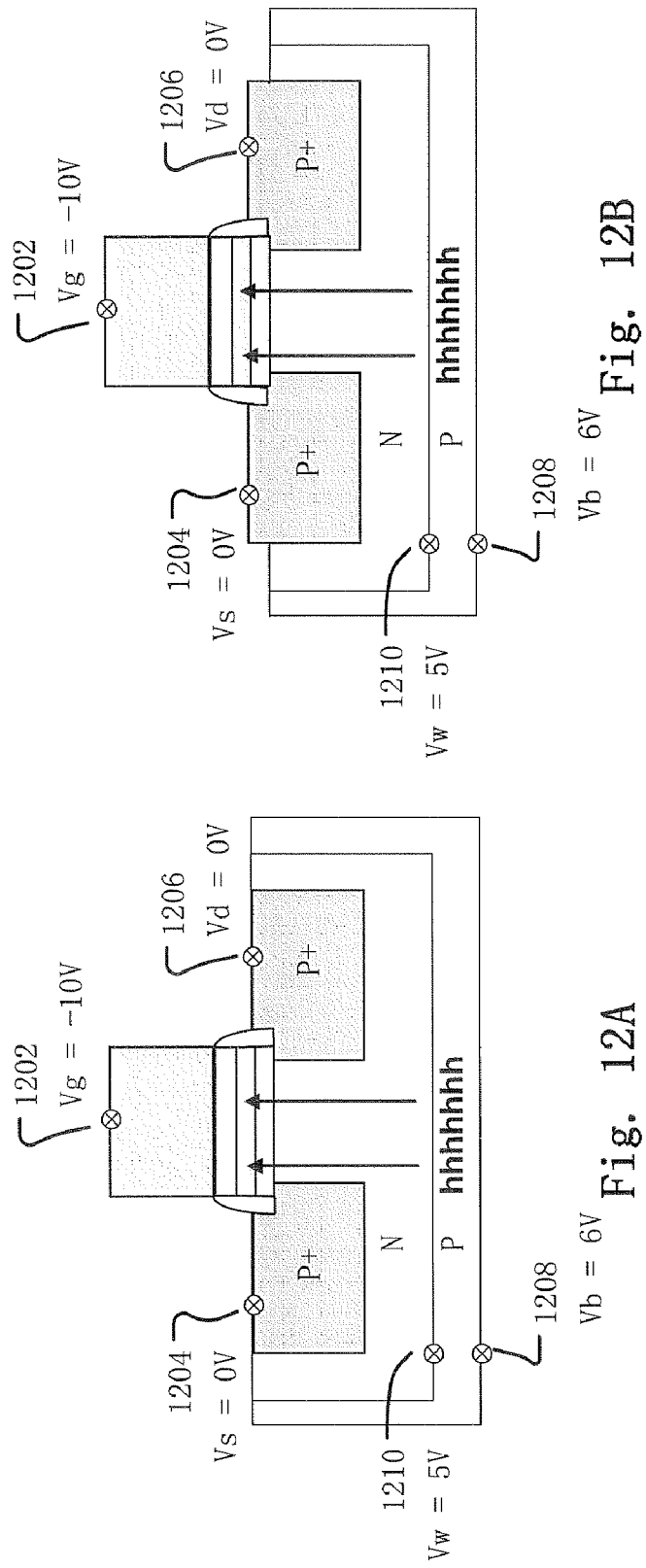

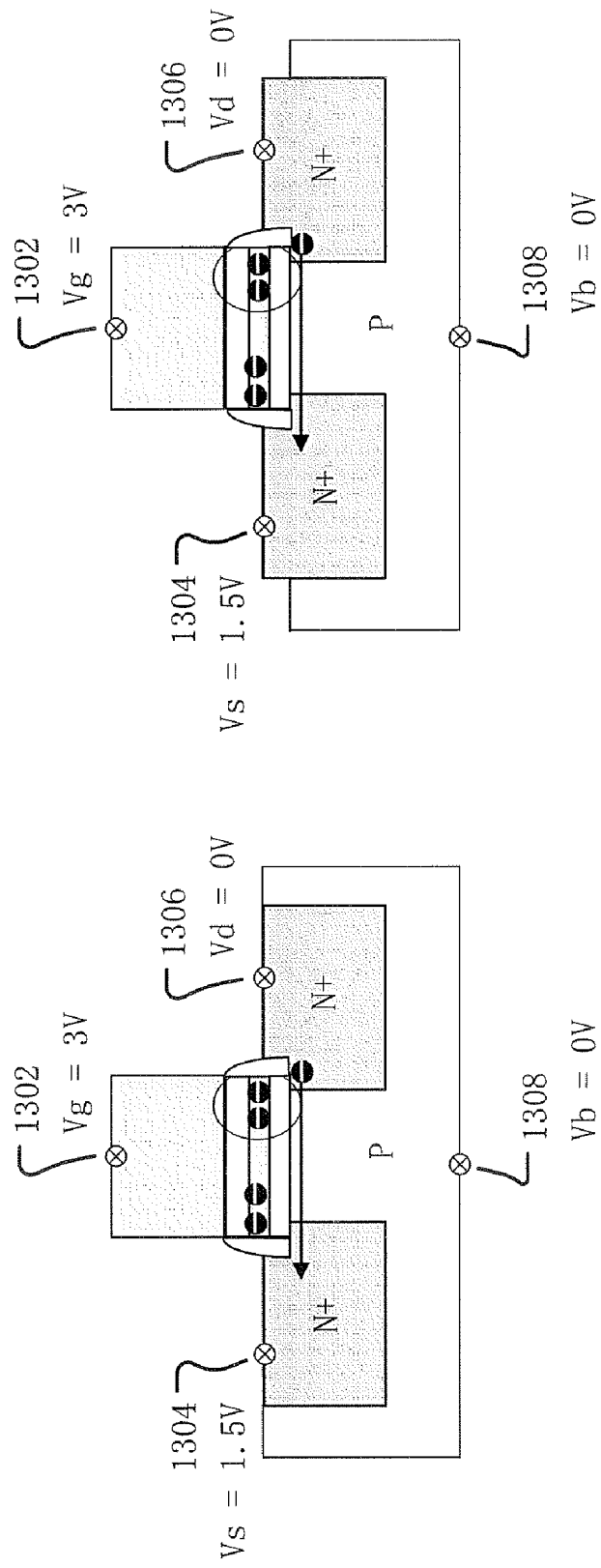

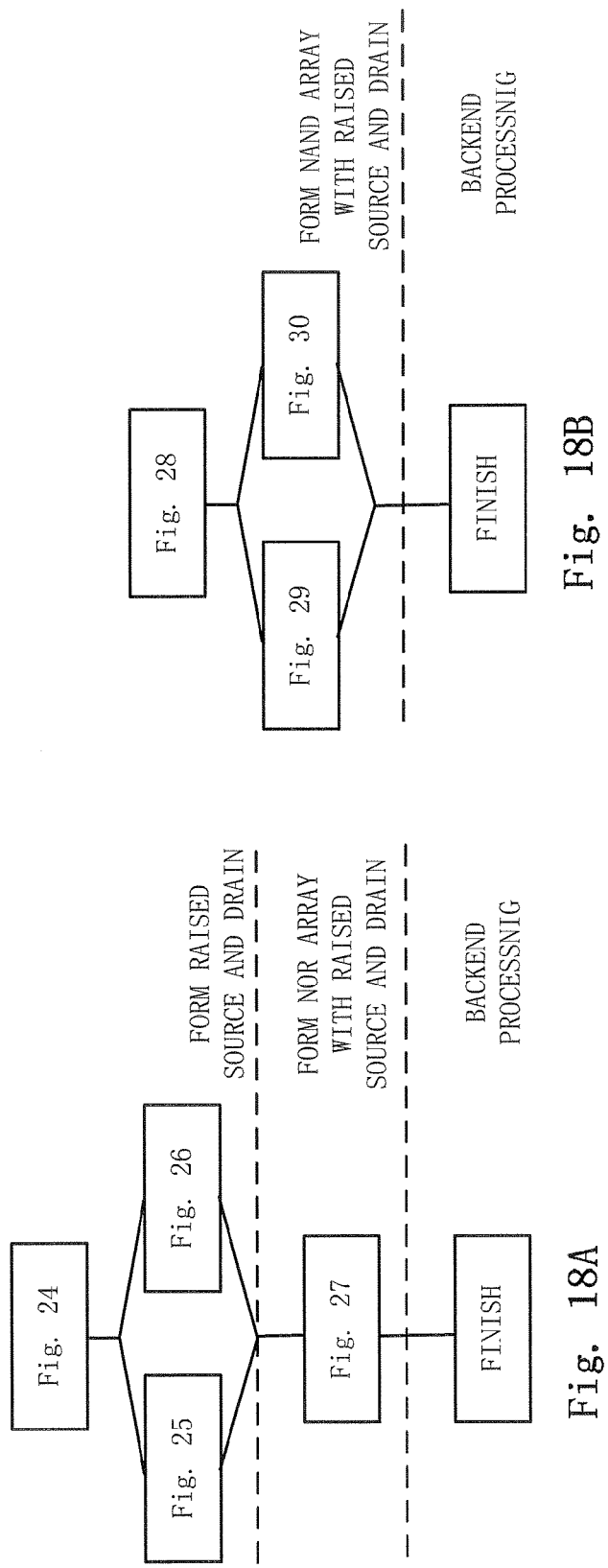

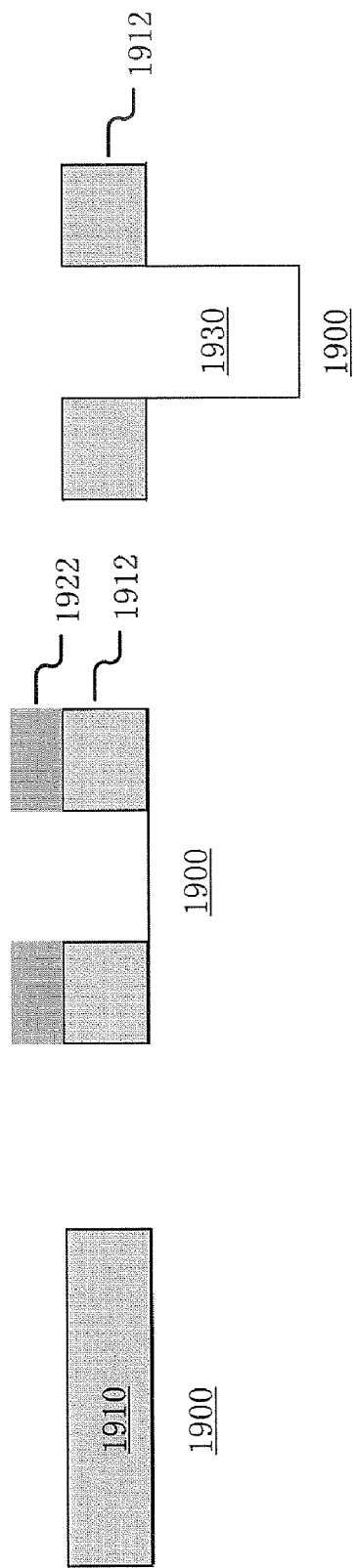

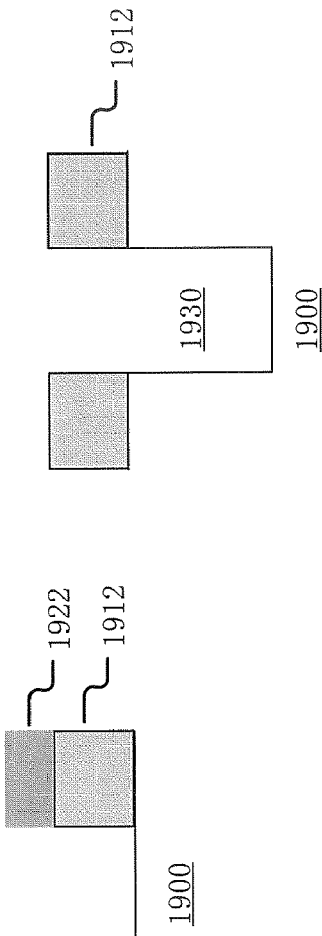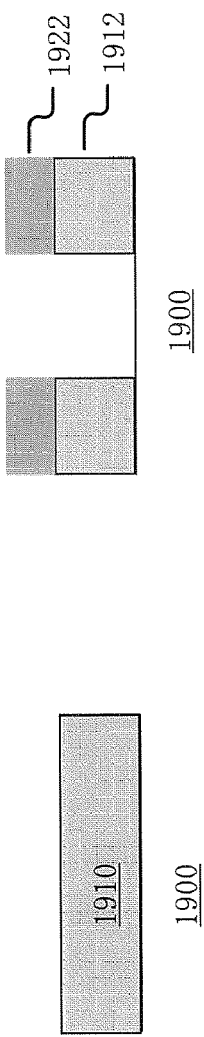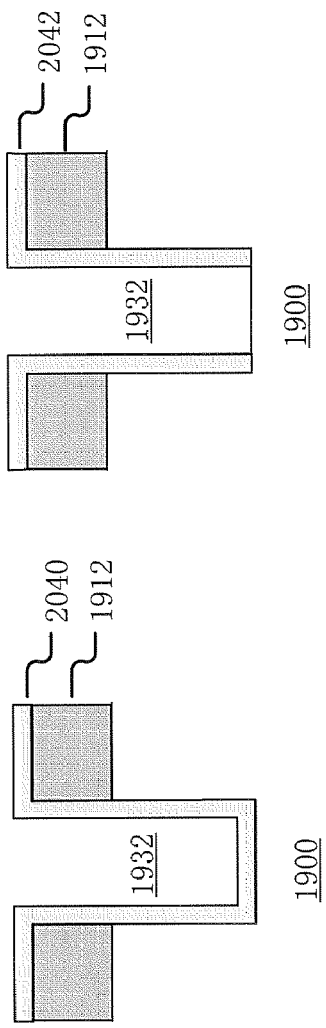
Fig. 20A  Fig. 20B  Fig. 20C  Fig. 20D  Fig. 20E

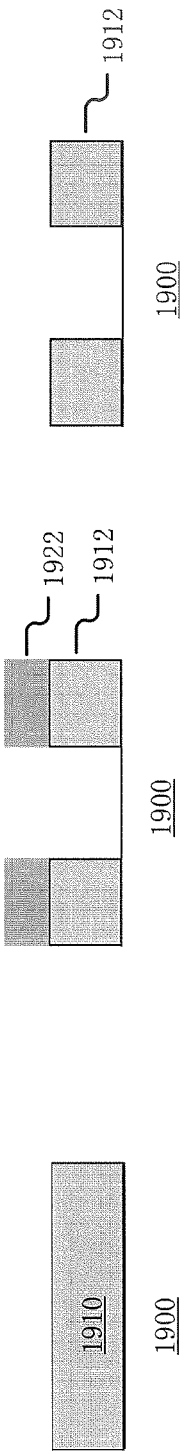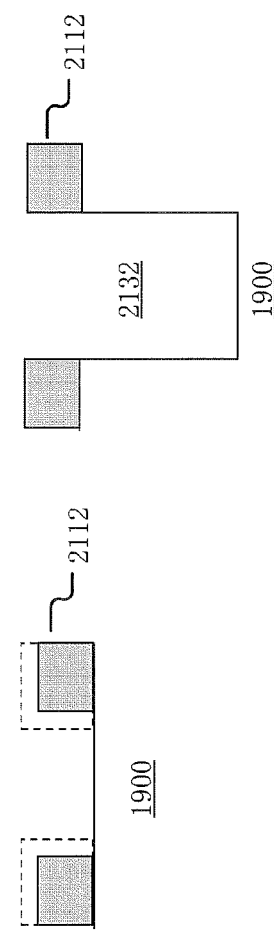
Fig. 21A, Fig. 21B, Fig. 21C, Fig. 21D, Fig. 21E

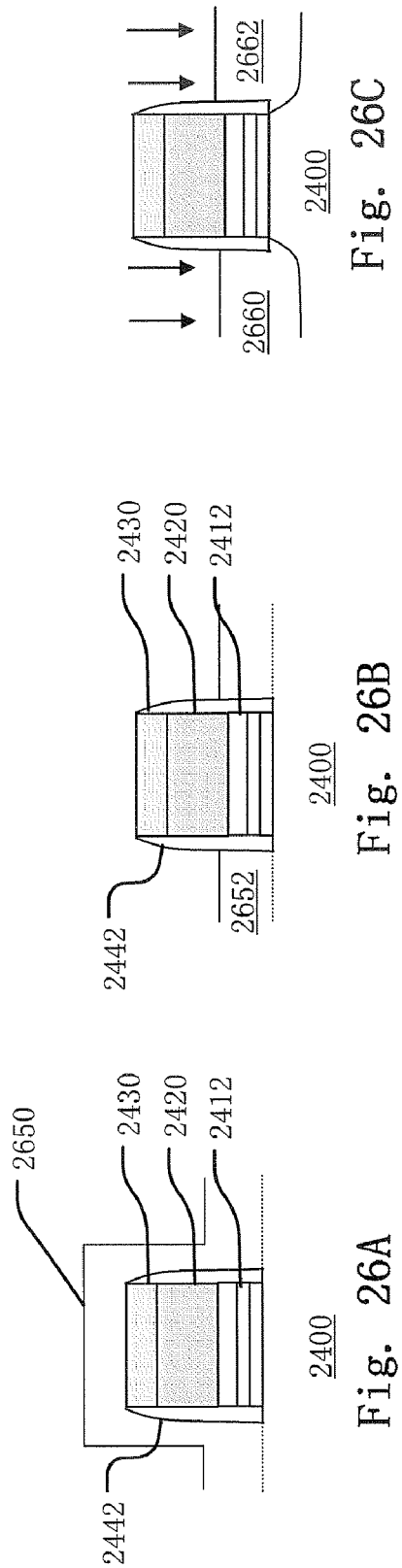

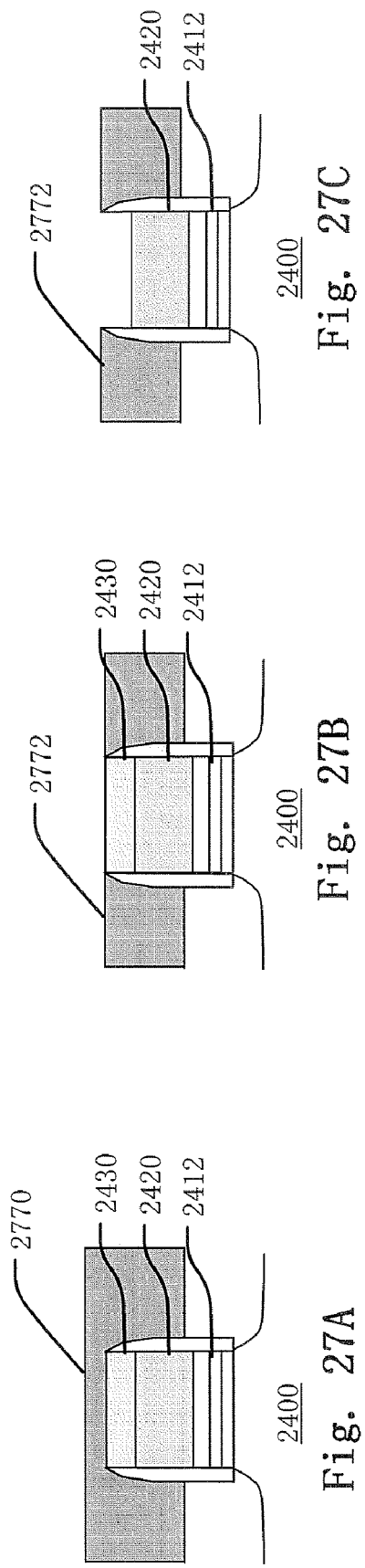

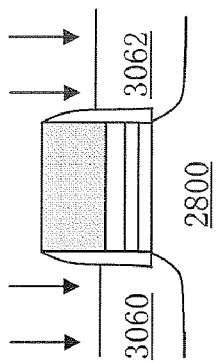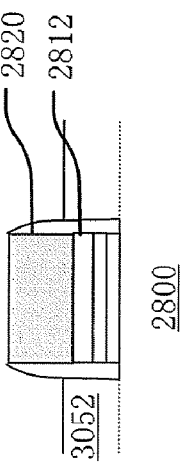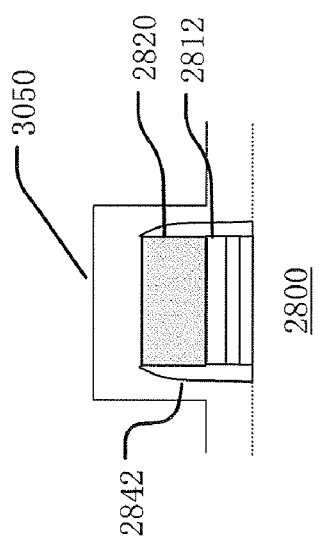

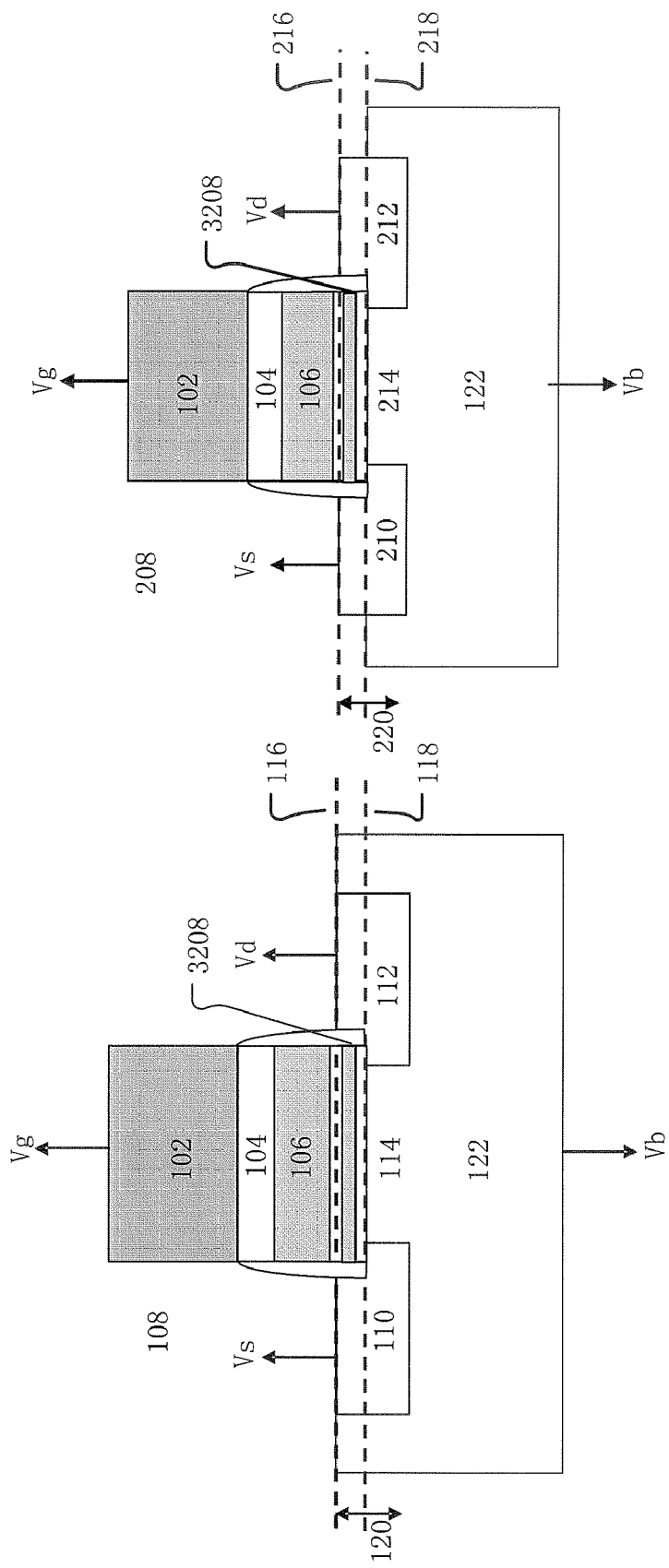

NONVOLATILE MEMORY ARRAY HAVING MODIFIED CHANNEL REGION INTERFACE

REFERENCE TO RELATED APPLICATION

This application claims the benefit of U.S. Provisional Patent Application No. 60/806,840, filed 10 Jul. 2006 by inventor Yi Ying Liao entitled Recess-Channel Non-Volatile Memory Cell Structure, Manufacturing Methods and Operating Methods.

BACKGROUND OF THE INVENTION

1. Field of the Invention

The technology relates to nonvolatile memory, and in particular, nonvolatile memory with a modified channel region interface, such as a raised source and drain or a recessed channel region.

2. Description of Prior Art

Electrically programmable and erasable non-volatile memory technologies based on charge storage structures known as EEPROM and flash memory are used in a variety of modem applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names PHINES, SONOS, or NROM, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional nonvolatile nitride cell structures are planar, such that the oxide-nitride-oxide (ONO) structure is formed on the surface of the substrate. However, such planar structures are associated with poor scalability, high power program and erase operations, and a high sheet resistance. Such a structure is described in YEH, C. C., et al., "PHINES: A Novel Low Power Program/Erase, Small Pitch, 2-Bit per Cell Flash Memory," Electron Devices Meeting, 2002. IEDM '02. Digest. International, 8-11 Dec. 2002, Pages: 931-934.

Accordingly, it would be desirable to modify the planar structure of conventional nonvolatile nitride cell structures, to address one or more of these shortcomings.

SUMMARY OF THE INVENTION

One aspect of the technology is a nonvolatile memory cell integrated circuit, comprising a nonvolatile memory array.

The nonvolatile memory array includes multiple columns, each including multiple nonvolatile memory cells arranged in a series. A subset of nonvolatile memory cells in the series are electrically connected to a bit line via other nonvolatile memory cells in the series. An example is the NAND arrangement.

Each nonvolatile memory cell of the array includes a charge storage structure, source and drain regions, and one or more dielectric structures. The charge storage structure stores charge to control a logical state stored by the nonvolatile memory cell integrated circuit. In various embodiments, the charge storage structure stores one bit or multiple bits. In various embodiments, the material of the charge storage structure is a charge trapping structure or a nanocrystal structure. The source and drain regions are separated by a channel region, which is part of the circuit that undergoes inversion to electrically connect the source and drain regions. The dielectric structures electrically isolate parts of the circuit from each other, in the absence of an electrical field to overcome the dielectric structures. The dielectric structures are at least partly between the charge storage structure and the channel region and at least partly between the charge storage structure and a source of gate voltage.

For each nonvolatile memory cell of the array, an interface separates part of the one or more dielectric structures from the channel region. A first end of the interface ends at an intermediate part of the source region and a second end of the interface ends at an intermediate part of the drain region. To implement the interface, in one embodiment the channel region is recessed into a substrate of the nonvolatile memory cell integrated circuit.

Some embodiments include a gate length scaling dielectric layer at least partly between a substrate and the dielectric structures.

Another aspect of the technology is a method of making a nonvolatile memory cell array integrated circuit, comprising:
forming columns of nonvolatile memory cells in the array, each including nonvolatile memory cells arranged in a series. An example is the NAND arrangement. This step includes the following:
forming a charge storage structure and one or more dielectric structures for each nonvolatile memory cell in the array. The charge storage structure stores charge to control a logical state stored by the nonvolatile memory cell integrated circuit. In various embodiments, the charge storage structure stores one bit or multiple bits. In various embodiments, the material of the charge storage structure is a charge trapping structure or a nanocrystal structure. The dielectric structures are 1) at least partly between the charge storage structure and a channel region and 2) at least partly between the charge storage structure and a source of gate voltage.
forming a conductive layer providing the gate voltage.
forming bit lines providing drain voltage and source voltage to each column of nonvolatile memory cells in the array, such that a subset of nonvolatile memory cells in each column are electrically connected to a bit line via other nonvolatile memory cells in the series;
For each nonvolatile memory cell of the array, an interface separates part of the one or more dielectric structures from the channel region. A first end of the interface ends at an intermediate part of the first bit line and a second end of the interface ends at an intermediate part of the second bit line. To implement the interface, one embodiment forms a recess in a substrate, such that charge trapping structure and dielectric structures are formed in the recess.

Some embodiments scale gate length by forming a liner at least partly between the dielectric structures and a substrate. Some embodiments, prior to forming the charge storage structure and the dielectric structures, include: scaling gate length by forming a dielectric layer and removing parts of the dielectric layer.

Another aspect of the technology is a method of making a nonvolatile memory cell array integrated circuit, comprising:
forming a charge storage structure and one or more dielectric structures for each nonvolatile memory cell in the array. The charge storage structure stores charge to control a logical state stored by the nonvolatile memory cell integrated circuit. In various embodiments, the charge storage structure stores one bit or multiple bits. In various embodiments, the material of the charge storage structure is a charge trapping structure or a nanocrystal structure. The one or more dielectric structures are 1) at least partly between the charge storage structure and a channel region and 2) at least partly between the charge storage structure and a source of gate voltage.

forming a first part of the conductive layer providing the gate voltage.

after forming the first part of the conductive layer providing the gate voltage, forming bit lines providing drain voltage and source voltage to each nonvolatile memory cell in the array, such as by adding dopants. The channel region of each nonvolatile memory cell in the array extends between a first bit line of the bit lines providing the drain voltage and a second bit line of the bit lines providing the source voltage. An example is the NOR arrangement.

after forming the bit lines, forming a second part of the conductive layer providing the gate voltage. The first part and the second part of the conductive layer are physically connected. Some embodiments include, forming a dielectric layer separating the bit lines from the second part of the conductive layer.

For each nonvolatile memory cell of the array, an interface separates part of the one or more dielectric structures from the channel region. A first end of the interface ends at an intermediate part of the first bit line and a second end of the interface ends at an intermediate part of the second bit line. To implement the interface, one embodiment forms a recess in a substrate, such that charge trapping structure and dielectric structures are formed in the recess.

Some embodiments scale gate length by forming a liner at least partly between the one or more dielectric structures and a substrate. Some embodiments, prior to forming the charge storage structure and the dielectric structures, include: scaling gate length by forming a dielectric layer and removing parts of the dielectric layer.

In other embodiments of the technology, the dielectric structure between at least partly between the charge trapping structure and the channel region, includes an ONO structure as disclosed herein.

BRIEF DESCRIPTION OF THE DRAWINGS

FIG. 1 is a diagram of a nonvolatile memory cell with a recessed channel between the source and drain regions.

FIG. 2 is a diagram of a nonvolatile memory cell with source and drain regions raised from the semiconductor substrate.

FIG. 3A is a diagram of electron injection from the gate to the charge storage structure, in a nonvolatile memory cell with a recessed channel.

FIG. 3B is a diagram of electron injection from the gate to the charge storage structure, in a nonvolatile memory cell with raised source and drain regions.

FIG. 4A is a diagram of electron injection from the substrate to the charge storage structure, in a nonvolatile memory cell with a recessed channel.

FIG. 4B is a diagram of electron injection from the substrate to the charge storage structure, in a nonvolatile memory cell with raised source and drain regions.

FIG. 7A is a diagram of substrate hot electron injection to the charge storage structure, in a nonvolatile memory cell with a recessed channel.

FIG. 7B is a diagram of substrate hot electron injection to the charge storage structure, in a nonvolatile memory cell with raised source and drain regions.

FIG. 8A is a diagram of hole injection from the gate to the charge storage structure, in a nonvolatile memory cell with a recessed channel.

FIG. 8B is a diagram of hole injection from the gate to the charge storage structure, in a nonvolatile memory cell with raised source and drain regions.

FIG. 9A is a diagram of hole injection from the substrate to the charge storage structure, in a nonvolatile memory cell with a recessed channel.

FIG. 9B is a diagram of hole injection from the substrate to the charge storage structure, in a nonvolatile memory cell with raised source and drain regions.

FIG. 12A is a diagram of substrate hot hole injection to the charge storage structure, in a nonvolatile memory cell with a recessed channel.

FIG. 12B is a diagram of substrate hot hole injection to the charge storage structure, in a nonvolatile memory cell with raised source and drain regions.

FIG. 13A is a diagram of a reverse read operation to read the data stored on the right side of the charge storage structure, in a nonvolatile memory cell with a recessed channel.

FIG. 13B is a diagram of a reverse read operation to read the data stored on the right side of the charge storage structure, in a nonvolatile memory cell with raised source and drain regions.

FIG. 18A is a flow diagram to make a NOR array of nonvolatile memory cells having raised source and drain regions, showing various possible combinations of the process steps of FIGS. 24 to 27.

FIG. 18B is a flow diagram to make a NAND array of nonvolatile memory cells having raised source and drain regions, showing various possible combinations of the process steps of FIGS. 28 to 30.

FIGS. 19A to 19C are process steps to form a recess in a nonvolatile memory cell with a recessed channel, preceding either FIG. 22 or 23.

FIGS. 20A to 20E are process steps to scale a gate length prior to forming a recess in a nonvolatile memory cell, preceding either FIG. 22 or 23.

FIGS. 21A to 21E are process steps to enlarge a gate length prior to forming a recess in a nonvolatile memory cell, preceding either FIG. 22 or 23.

FIGS. 26A to 26C are ending process steps using polysilicon to form raised source and drain regions of a nonvolatile memory cell in a NOR array, following FIG. 24 and preceding FIG. 27.

FIGS. 27A to 27D are ending process steps to form a NOR array of nonvolatile memory cells each having raised source and drain regions, preceding FIG. 25 or 26.

FIGS. 30A to 30C are ending process steps using polysilicon to form a NAND array of nonvolatile memory cells each having raised source and drain regions, following FIG. 28.

FIG. 32 is a diagram of a nonvolatile memory cell with a recessed channel between the source and drain regions, whereby the lower dielectric structure has a tri-layer thin ONO structure.

FIG. 33 is a diagram of a nonvolatile memory cell with source and drain regions raised from the semiconductor substrate, whereby the lower dielectric structure has a tri-layer thin ONO structure.

DETAILED DESCRIPTION

Figures 5A, 5B:
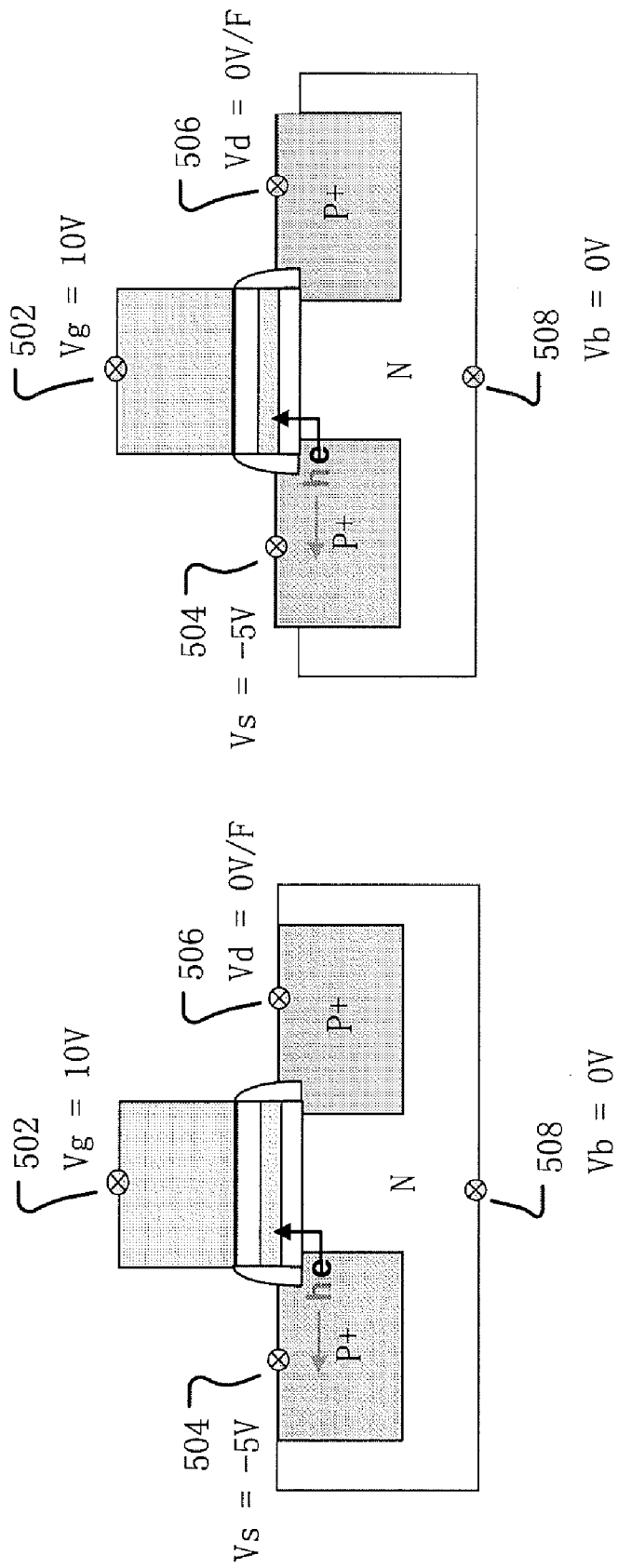
FIG. 5A is a diagram of band-to-band hot electron injection to the charge storage structure, in a nonvolatile memory cell with a recessed channel.
FIG. 5B is a diagram of band-to-band hot electron injection to the charge storage structure, in a nonvolatile memory cell with raised source and drain regions.

FIG. 1 is a diagram of a nonvolatile memory cell with a recessed channel between the source and drain regions.

The gate 102, in many embodiments part of a word line, has a gate voltage Vg. In some embodiments, the gate structure comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the outer dielectric is around 3.15 eV. Thus, embodiments of the present technology use materials for the gate and for the outer dielectric having an injection barrier higher than about 3.15 eV, such as higher than about 3.4 eV, and preferably higher than about 4 eV. For p-type polysilicon gates with silicon dioxide outer dielectrics, the injection barrier is about 4.25 eV, and the resulting threshold of a converged cell is reduced about 2 volts relative to a cell having an n-type polysilicon gate with a silicon dioxide outer dielectric.

A dielectric structure 104 is between the gate 102 and the charge storage structure 106. Another dielectric structure 108 is between the charge storage structure 108 and the channel region 114. Representative dielectrics include silicon dioxide and silicon oxynitride having a thickness of about 2 to 10 nanometers, or other similar high dielectric constant materials, including for example $Al_2O_3$.

The charge storage structure 106 stores charge to control a logical state stored by the nonvolatile memory cell. An older embodiment of a charge storage structure is conductive, for example polysilicon, such that stored charge spreads throughout the charge storage structure. Newer embodiments of a charge storage structure are charge trapping and nanocrystal structures. Such newer embodiments, unlike conductive materials, store charge at particular locations of the charge storage structure, thereby enabling different locations of the charge storage structure to store distinct logical states. Representative charge trapping structures include silicon nitride having a thickness of about 3 to 9 nanometers.

A source region 110 has a source voltage Vs and a drain region 112 has a drain voltage Vd. The source region 110 and the drain region 112 are in many embodiments portions of bit lines, and are characterized by a junction depth 120. The body region 122, in many embodiments a substrate or a well, has a body voltage Vb. In response to an appropriate bias arrangement applied to the gate 102, source 110, drain 112, and body 122, a channel 114 is formed which electrically connects the source 110 and the drain 112.

The upper border of the source and drain regions 116 is higher than the interface 118 between the channel 114 and the dielectric structure 108. However, the interface 118 between the channel 114 and the dielectric structure 108 remains above the lower border of the source and drain regions. Thus, the interface 118 between the channel 114 and the dielectric structure 108 ends at intermediate regions of the source region 110 and the drain region 112.

The upper border of the source region 110 and the drain region 112 is in line with the upper border of the body region 122. Consequently, the nonvolatile memory cell of FIG. 1 is the recessed channel embodiment.

FIG. 2 is a diagram of a nonvolatile memory cell with source and drain regions raised from the semiconductor substrate. The nonvolatile memory cells of FIGS. 1 and 2 are substantially similar. However, the upper border of the source region 210 and the drain region 212 is above the upper border of the body region 122. Consequently, the nonvolatile memory cell of FIG. 2 is the raised source and drain embodiment. The interface 218 between the channel 214 and the dielectric structure 208 still ends at intermediate regions of the source region 210 and the drain region 212. The source region 210 and the drain region 212 are characterized by a junction depth 220.

FIG. 3A is a diagram of electron injection from the gate to the charge storage structure, in a nonvolatile memory cell with a recessed channel.

The gate region 302 has a gate voltage Vg of –10V. The source region 304 has a source voltage Vs of 10V or floating. The drain region 306 has a drain voltage Vd of 10V or floating. The body region 308 has a body voltage Vb of 10V.

FIG. 3B is a diagram of electron injection from the gate to the charge storage structure, in a nonvolatile memory cell with raised source and drain regions. The biasing arrangement of FIG. 3B is similar to that of FIG. 3A.

FIG. 4A is a diagram of electron injection from the substrate to the charge storage structure, in a nonvolatile memory cell with a recessed channel.

The gate region 402 has a gate voltage Vg of 10V. The source region 404 has a source voltage Vs of –10V or floating. The drain region 406 has a drain voltage Vd of –10V or floating. The body region 408 has a body voltage Vb of –10V.

FIG. 4B is a diagram of electron injection from the substrate to the charge storage structure, in a nonvolatile memory cell with raised source and drain regions. The biasing arrangement of FIG. 4B is similar to that of FIG. 4A.

FIG. 5A is a diagram of band-to-band hot electron injection to the charge storage structure, in a nonvolatile memory cell with a recessed channel.

The gate region 502 has a gate voltage Vg of 10V. The p+ type source region 504 has a source voltage Vs of –5V. The p+ type drain region 506 has a drain voltage Vd of 0V or floating. The n type body region 508 has a body voltage Vb of 0V.

FIG. 5B is a diagram of band-to-band hot electron injection to the charge storage structure, in a nonvolatile memory cell with raised source and drain regions. The biasing arrangement of FIG. 5B is similar to that of FIG. 5A.

Figure 6B:
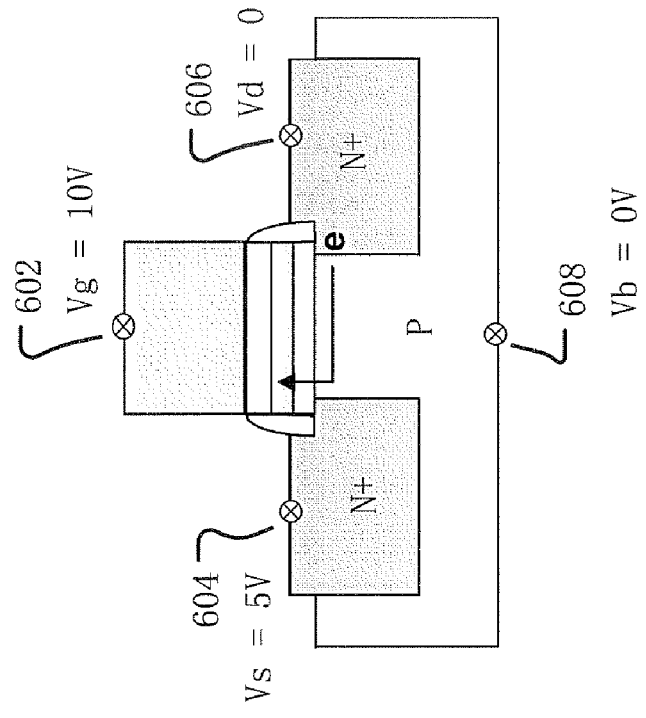
FIG. 6B is a diagram of channel hot electron injection to the charge storage structure, in a nonvolatile memory cell with raised source and drain regions.
Figure 6A:
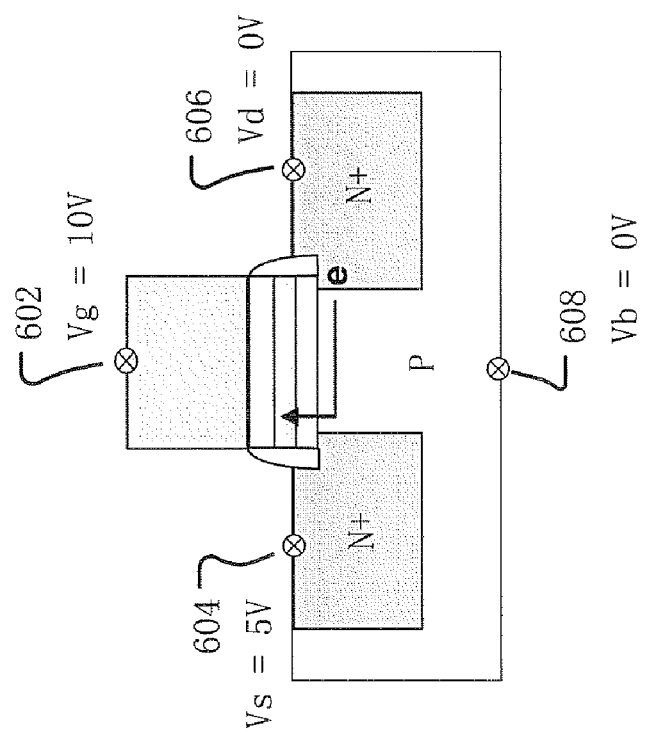
FIG. 6A is a diagram of channel hot electron injection to the charge storage structure, in a nonvolatile memory cell with a recessed channel.

FIG. 6A is a diagram of channel hot electron injection to the charge storage structure, in a nonvolatile memory cell with a recessed channel.

The gate region 602 has a gate voltage Vg of 10V. The n+ type source region 604 has a source voltage Vs of –5V. The n+ type drain region 606 has a drain voltage Vd of 0V. The p type body region 608 has a body voltage Vb of 0V.

FIG. 6B is a diagram of channel hot electron injection to the charge storage structure, in a nonvolatile memory cell with raised source and drain regions. The biasing arrangement of FIG. 6B is similar to that of FIG. 6A.

FIG. 7A is a diagram of substrate hot electron injection to the charge storage structure, in a nonvolatile memory cell with a recessed channel.

The gate region 702 has a gate voltage Vg of 10V. The n+ type source region 704 has a source voltage Vs of 0V. The n+ type drain region 706 has a drain voltage Vd of 0V. The n type body region 708 has a body voltage Vb of –6V. The p type well region 710 has a well voltage Vw of –5V. The source region 704 and drain region 706 are in the well region 710, which in turn is in the body region 708.

FIG. 7B is a diagram of substrate hot electron injection to the charge storage structure, in a nonvolatile memory cell with raised source and drain regions. The biasing arrangement of FIG. 7B is similar to that of FIG. 7A.

FIG. 8A is a diagram of hole injection from the gate to the charge storage structure, in a nonvolatile memory cell with a recessed channel.

The gate region 802 has a gate voltage Vg of 10V. The source region 804 has a source voltage Vs of –10V or floating. The drain region 806 has a drain voltage Vd of –10V or floating. The body region 808 has a body voltage Vb of –10V.

FIG. 8B is a diagram of hole injection from the gate to the charge storage structure, in a nonvolatile memory cell with raised source and drain regions. The biasing arrangement of FIG. 8B is similar to that of FIG. 8A.

FIG. 9A is a diagram of hole injection from the substrate to the charge storage structure, in a nonvolatile memory cell with a recessed channel.

The gate region 902 has a gate voltage Vg of –10V. The source region 904 has a source voltage Vs of 10V or floating. The drain region 906 has a drain voltage Vd of 10V or floating. The body region 908 has a body voltage Vb of 10V.

FIG. 9B is a diagram of hole injection from the substrate to the charge storage structure, in a nonvolatile memory cell with raised source and drain regions. The biasing arrangement of FIG. 9B is similar to that of FIG. 9A.

Figure 10A:
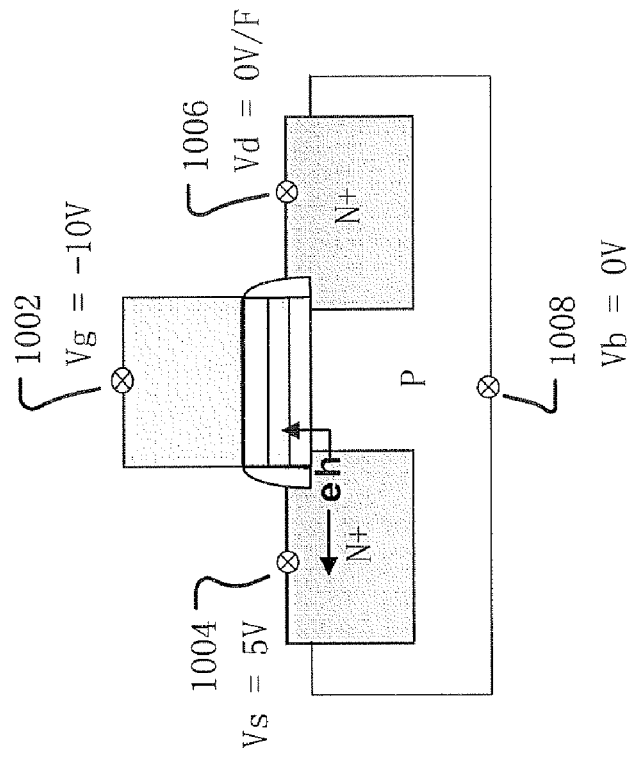
FIG. 10A is a diagram of band-to-band hot hole injection to the charge storage structure, in a nonvolatile memory cell with a recessed channel.

FIG. 10A is a diagram of band-to-band hot hole injection to the charge storage structure, in a nonvolatile memory cell with a recessed channel.

The gate region 1002 has a gate voltage Vg of –10V. The n+ type source region 1004 has a source voltage Vs of 5V. The n+ type drain region 1006 has a drain voltage Vd of 0V or floating. The p type body region 1008 has a body voltage Vb of 0V.

Figure 10B:
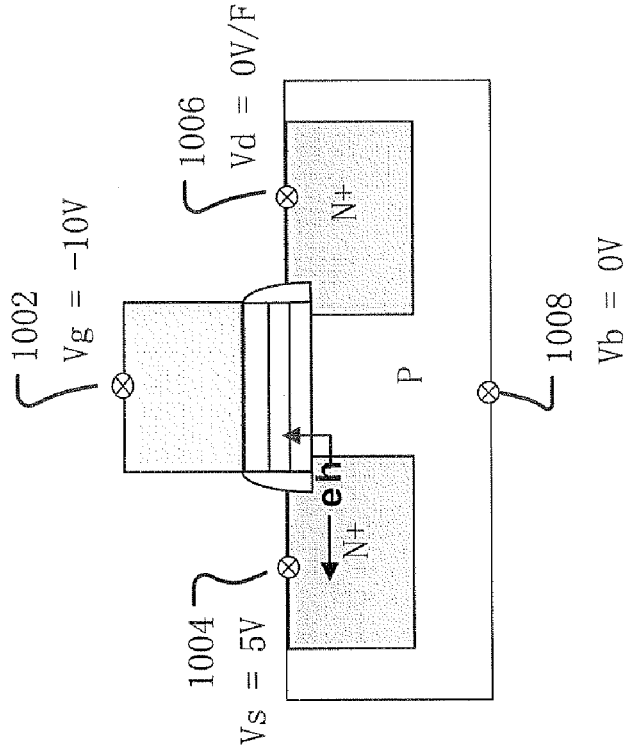
FIG. 10B is a diagram of band-to-band hot hole injection to the charge storage structure, in a nonvolatile memory cell with raised source and drain regions.

FIG. 10B is a diagram of band-to-band hot hole injection to the charge storage structure, in a nonvolatile memory cell with raised source and drain regions. The biasing arrangement of FIG. 10B is similar to that of FIG. 10A.

Figure 11A:
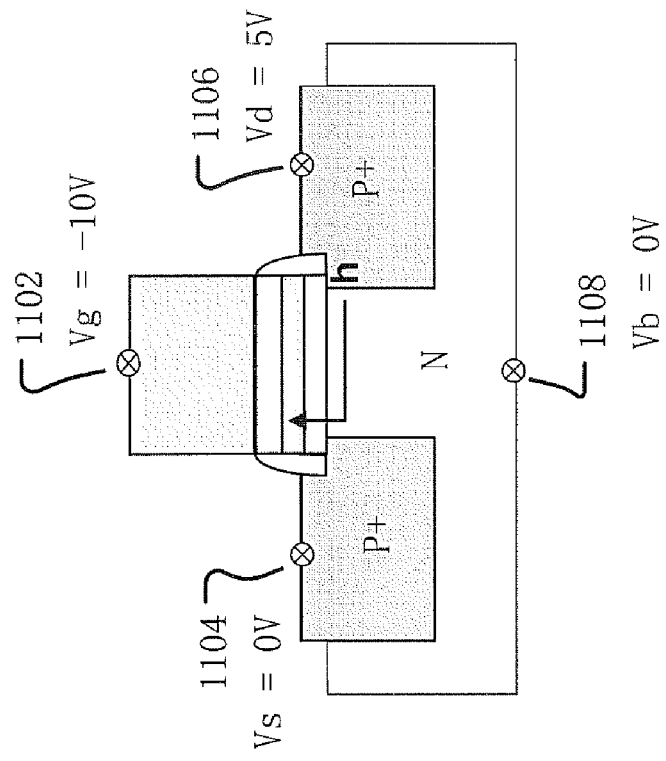
FIG. 11A is a diagram of channel hot hole injection to the charge storage structure, in a nonvolatile memory cell with a recessed channel.

FIG. 11A is a diagram of channel hot hole injection to the charge storage structure, in a nonvolatile memory cell with a recessed channel.

The gate region 1102 has a gate voltage Vg of –0V. The p+ type source region 1104 has a source voltage Vs of 0V. The p+ type drain region 1106 has a drain voltage Vd of 5V. The n type body region 1108 has a body voltage Vb of 0V.

Figure 11B:
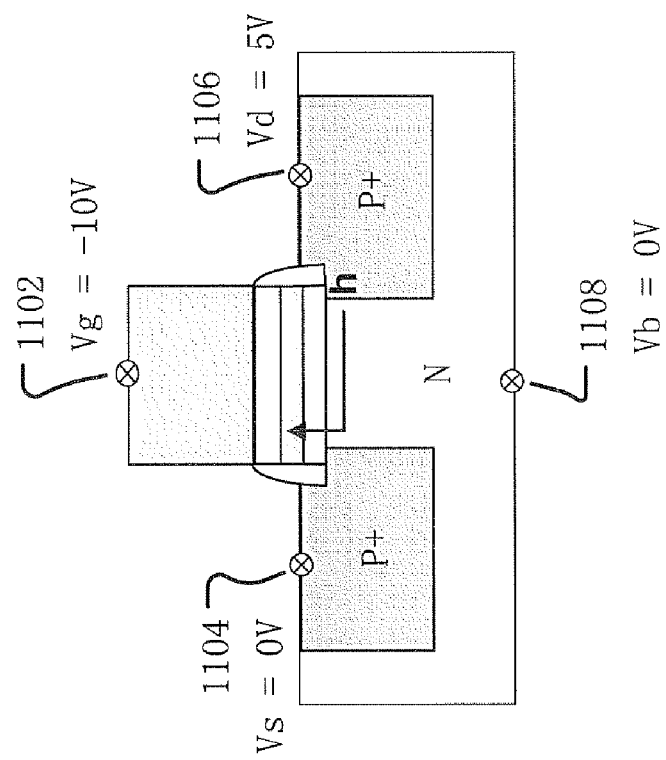
FIG. 11B is a diagram of channel hot hole injection to the charge storage structure, in a nonvolatile memory cell with raised source and drain regions.

FIG. 11B is a diagram of channel hot hole injection to the charge storage structure, in a nonvolatile memory cell with raised source and drain regions. The biasing arrangement of FIG. 11B is similar to that of FIG. 11A.

FIG. 12A is a diagram of substrate hot hole injection to the charge storage structure, in a nonvolatile memory cell with a recessed channel.

The gate region 1202 has a gate voltage Vg of –10V. The p+ type source region 1204 has a source voltage Vs of 0V. The p+ type drain region 1206 has a drain voltage Vd of 0V. The p type body region 1208 has a body voltage Vb of 6V. The n type well region 1210 has a well voltage Vw of 5V. The source region 1204 and drain region 1206 are in the well region 1210, which in turn is in the body region 1208.

FIG. 12B is a diagram of substrate hot hole injection to the charge storage structure, in a nonvolatile memory cell with raised source and drain regions. The biasing arrangement of FIG. 12B is similar to that of FIG. 12A.

FIG. 13A is a diagram of a reverse read operation to read the data stored on the right side of the charge storage structure, in a nonvolatile memory cell with a recessed channel.

The gate region 1302 has a gate voltage Vg of 3V. The n+ type source region 1304 has a source voltage Vs of 1.5V. The n+ type drain region 1306 has a drain voltage Vd of 0V. The p type body region 1308 has a body voltage Vb of 0V.

FIG. 13B is a diagram of a reverse read operation to read the data stored on the right side of the charge storage structure, in a nonvolatile memory cell with raised source and drain regions. The biasing arrangement of FIG. 13B is similar to that of FIG. 13A.

Figure 14A:
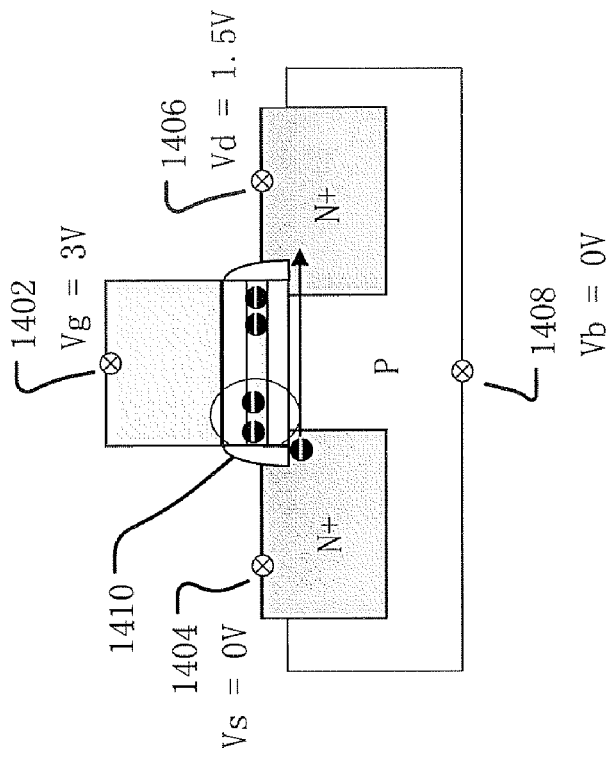
FIG. 14A is a diagram of a reverse read operation to read the data stored on the left side of the charge storage structure, in a nonvolatile memory cell with a recessed channel.

FIG. 14A is a diagram of a reverse read operation to read the data stored on the left side of the charge storage structure, in a nonvolatile memory cell with a recessed channel.

The gate region 1402 has a gate voltage Vg of 3V. The n+ type source region 1404 has a source voltage Vs of 0V. The n+ type drain region 1406 has a drain voltage Vd of 1.5V. The p type body region 1408 has a body voltage Vb of 0V.

Figure 14B:
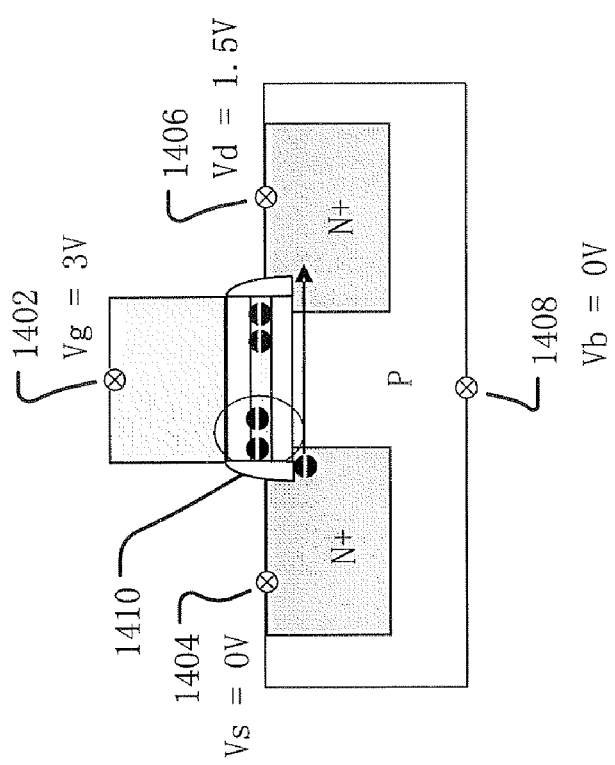
FIG. 14B is a diagram of a reverse read operation to read the data stored on the left side of the charge storage structure, in a nonvolatile memory cell with raised source and drain regions.

FIG. 14B is a diagram of a reverse read operation to read the data stored on the left side of the charge storage structure, in a nonvolatile memory cell with raised source and drain regions. The biasing arrangement of FIG. 14B is similar to that of FIG. 14A.

Figure 15A:
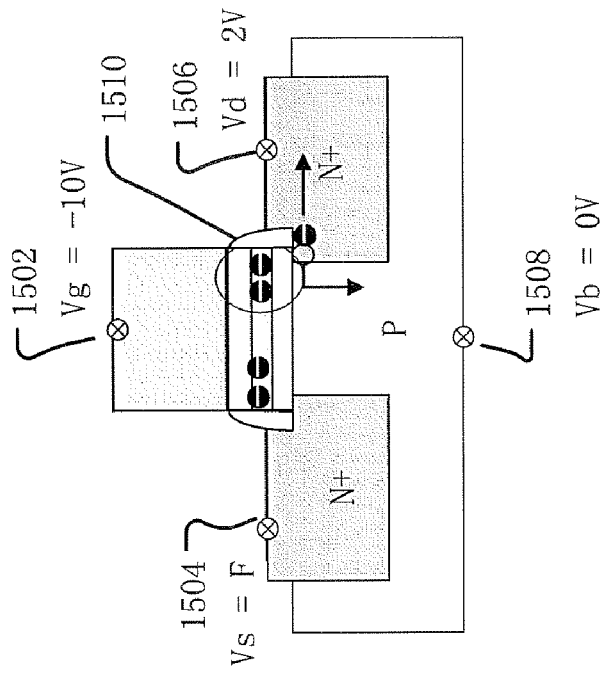
FIG. 15A is a diagram of a band-to-band read operation to read the data stored on the right side of the charge storage structure, in a nonvolatile memory cell with a recessed channel.

FIG. 15A is a diagram of a band-to-band read operation to read the data stored on the right side of the charge storage structure, in a nonvolatile memory cell with a recessed channel.

The gate region 1502 has a gate voltage Vg of −10V. The n+ type source region 1504 has a source voltage Vs of floating. The n+ type drain region 1506 has a drain voltage Vd of 2V. The p type body region 1508 has a body voltage Vb of 0V.

Figure 15B:
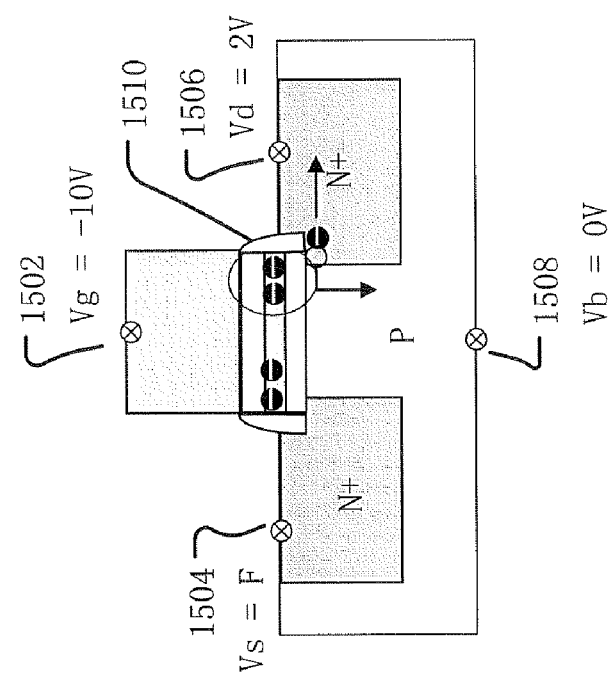
FIG. 15B is a diagram of a band-to-band read operation to read the data stored on the right side of the charge storage structure, in a nonvolatile memory cell with raised source and drain regions.

FIG. 15B is a diagram of a band-to-band read operation to read the data stored on the right side of the charge storage structure, in a nonvolatile memory cell with raised source and drain regions. The biasing arrangement of FIG. 15B is similar to that of FIG. 15A.

Figure 16B:
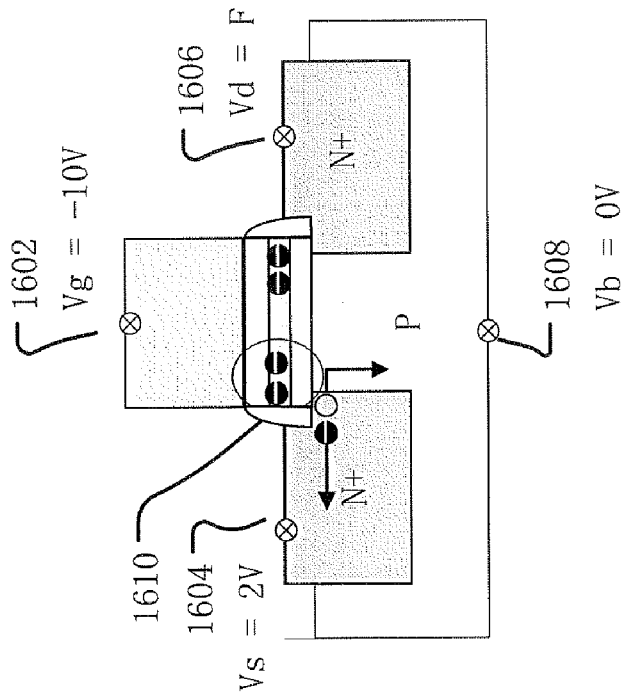
FIG. 16B is a diagram of a band-to-band read operation to read the data stored on the left side of the charge storage structure, in a nonvolatile memory cell with raised source and drain regions.
Figure 16A:
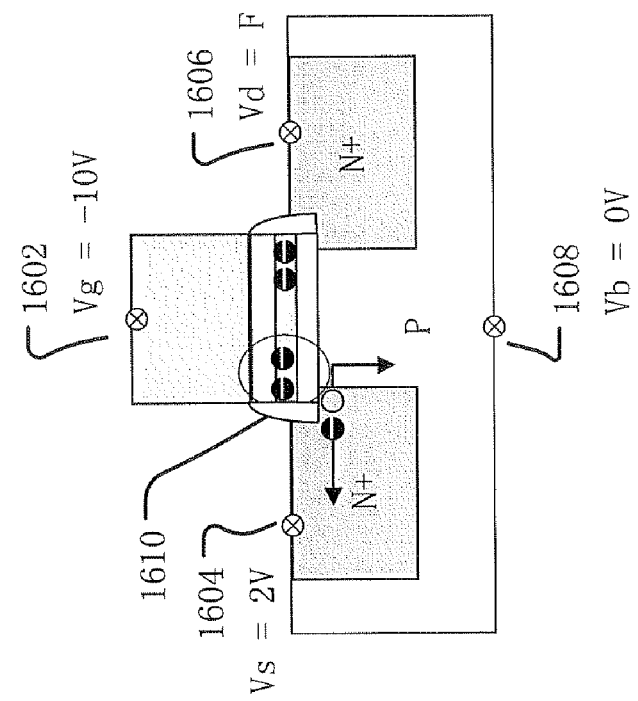
FIG. 16A is a diagram of a band-to-band read operation to read the data stored on the left side of the charge storage structure, in a nonvolatile memory cell with a recessed channel.

FIG. 16A is a diagram of a band-to-band read operation to read the data stored on the left side of the charge storage structure, in a nonvolatile memory cell with a recessed channel.

The gate region 1602 has a gate voltage Vg of −10V. The n+ type source region 1604 has a source voltage Vs of 2V. The n+ type drain region 1606 has a drain voltage Vd of floating. The p type body region 1608 has a body voltage Vb of 0V.

FIG. 16B is a diagram of a band-to-band read operation to read the data stored on the left side of the charge storage structure, in a nonvolatile memory cell with raised source and drain regions. The biasing arrangement of FIG. 16B is similar to that of FIG. 16A.

Band-to-band currents flowing through the nonvolatile memory cell structure determine the charge storage state of a particular part of the charge storage structure with great precision, due to combined vertical and lateral electrical fields. Larger vertical and lateral electrical fields give rise to larger band-to-band currents. A bias arrangement is applied to the various terminals, such that the energy bands bend sufficiently to cause band-to-band current in the nonvolatile memory cell structure, while keeping the potential difference between the nonvolatile memory cell nodes sufficiently low enough such that programming or erasing does not occur.

In example bias arrangements, the nonvolatile memory cell structure is reverse biased with respect to the active source region or drain region, and the body region, giving rise to reverse biased junction. Additionally, the voltage of the gate structure causes the energy bands to bend sufficiently such that band-to-band tunneling occurs through the nonvolatile memory cell structure. A high doping concentration in the one of the nonvolatile memory cell structure nodes (in many embodiments the source region or drain region), with the resulting high charge density of the space charge region, and the accompanying short length of the space charge region over which the voltage changes, contributes to the sharp energy band bending. Electrons in the valence band on one side of the reverse biased junction tunnel through the forbidden gap to the conduction band on the other side of the reverse biased junction and drift down the potential hill, deeper into the n-type node of the reverse biased junction. Similarly, holes drift up the potential hill, away from the n-type node of the reverse biased junction, and toward the p-type node of the reverse biased junction.

The voltage of the gate region controls the voltage of the portion of the reverse biased junction which is nearby the charge storage structure. As the voltage of the gate structure becomes more negative, the voltage of this portion of the reverse biased junction which is nearby the charge storage structure becomes more negative, resulting in deeper band bending in the diode structure. More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices,* 1981).

The net negative or net positive charge stored on the charge storage structure further affects the degree of band bending. In accordance with Gauss's Law, when a negative voltage is applied to the gate region relative to the reverse biased junction, a stronger electric field is experienced by portions of the reverse biased junction which are near portions of the charge storage structure having relatively higher net negative charge. Similarly, when a positive voltage is applied to the gate region relative to the reverse biased junction, a stronger electric field is experienced by portions of the reverse biased junction which are near portions of the charge storage structure having relatively higher net positive charge.

The different bias arrangements for reading, and bias arrangements for programming and erasing, show a careful balance. For reading, the potential difference between the reverse biased junction nodes should not cause a substantial number of charge carriers to transit a dielectric to the charge storage structure and affect the charge storage state (i.e. programmed logical level). In contrast, for programming and erasing, the potential difference between the reverse biased junction nodes can be sufficient to cause a substantial number of carriers to transit a dielectric and affect the charge storage state by band-to-band hot carrier injection.

Figure 17:
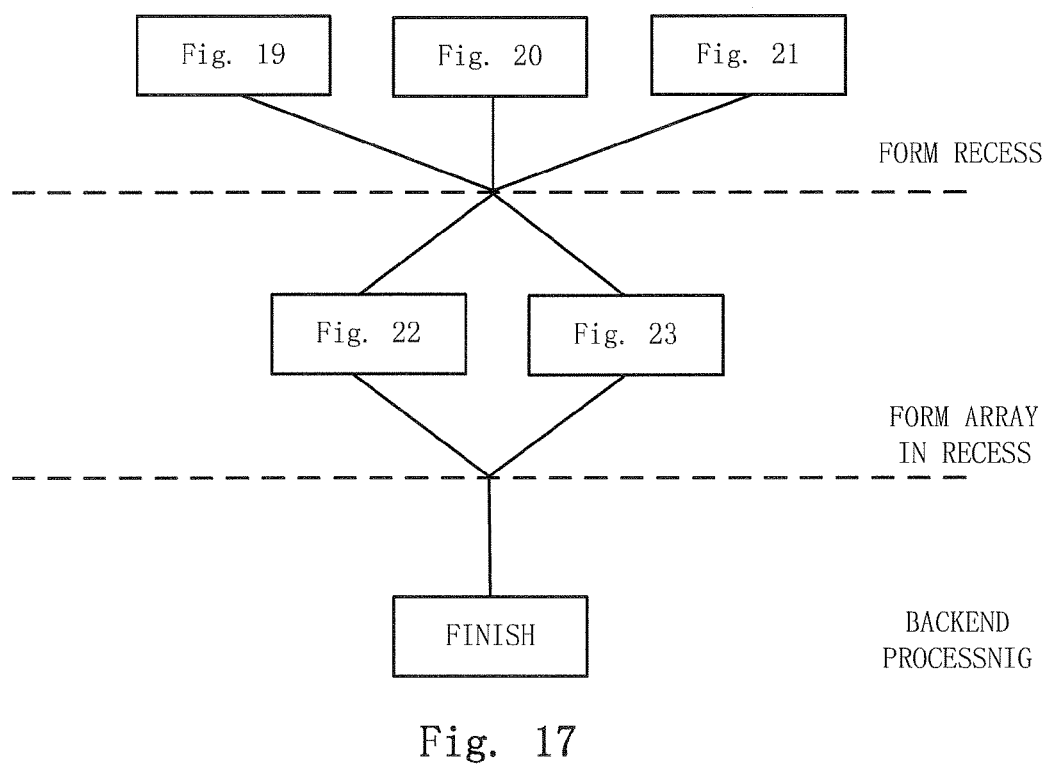
FIG. 17 is a flow diagram to make an array of nonvolatile memory cells having a recessed channel, showing various possible combinations of the process steps of FIGS. 19 to 23.

FIG. 17 is a flow diagram to make an array of nonvolatile memory cells having a recessed channel, showing various possible combinations of the process steps of FIGS. 19 to 23. FIG. 17 discloses the following process flow combinations: FIGS. 19 and 22; FIGS. 19 and 23; FIGS. 20 and 22; FIGS. 20 and 23; FIGS. 21 and 22; and FIGS. 21 and 23. These combinations are followed by back-end processes.

FIGS. 18A and 18B are flow diagrams relating to making an array of nonvolatile memory cells having raised source and drain regions.

FIG. 18A is a flow diagram to make a NOR array of nonvolatile memory cells having raised source and drain regions, showing various possible combinations of the process steps of FIGS. 24 to 27. FIG. 18A discloses the following process flow combinations: FIGS. 24, 25, and 27; and FIGS. 24, 26, and 27. These combinations are followed by back-end processes.

FIG. 18B is a flow diagram to make a NAND array of nonvolatile memory cells having raised source and drain regions, showing various possible combinations of the process steps of FIGS. 28 to 30. FIG. 18B discloses the following process flow combinations: FIGS. 28 and 29; and FIGS. 28 and 30. These combinations are followed by back-end processes.

FIGS. 19A to 19C are process steps to form a recess in a nonvolatile memory cell with a recessed channel, preceding either FIG. 22 or 23. In FIG. 19A, oxide 1910 is deposited on substrate 1900. Photoresist is deposited and patterned, and the patterned photoresist is used to remove parts of the oxide according to the photoresist pattern. In FIG. 19B, the remaining photoresist 1922 protects the remaining oxide 1912. The remaining photoresist is removed, and the substrate uncovered by the oxide is etched. In FIG. 19C, recess 1930 is etched into the substrate 1900 uncovered by the oxide 1912.

FIGS. 20A to 20E are process steps to scale a gate length prior to forming a recess in a nonvolatile memory cell, preceding either FIG. 22 or 23. FIGS. 20A to 20C are similar to FIGS. 19A to 19C. In FIG. 20D, a spacer 2040 is deposited into the recess, leaving a smaller recess 1932. In FIG. 20E, the spacer portion by the bottom of the recess is etched, leaving spacer 2042. This gate length scaling leaves a smaller gate length as compared to FIG. 19.

FIGS. 21A to 21E are process steps to enlarge a gate length prior to forming a recess in a nonvolatile memory cell, preceding either FIG. 22 or 23. FIGS. 21A to 21B are similar to FIGS. 19A to 19B. In FIG. 21 C, the remaining patterned photoresist is removed, uncovering the patterned oxide 1912. In FIG. 21D, the patterned oxide is etched, leaving a smaller patterned oxide 2112. In FIG. 21E, recess 2132 is etched into the substrate 1900 uncovered by the oxide 2112 This gate length scaling leaves a longer gate length as compared to FIG. 19.

Figure 22C:
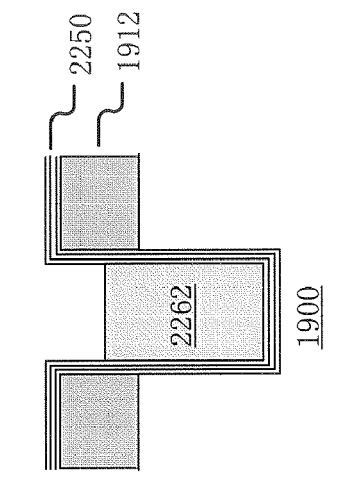
FIGS. 22A to 22K are ending process steps to form a NOR array of nonvolatile memory cells each in a recess, such that each nonvolatile memory cell has a recessed channel, following FIG. 19, 20, or 21.
Figure 22B:
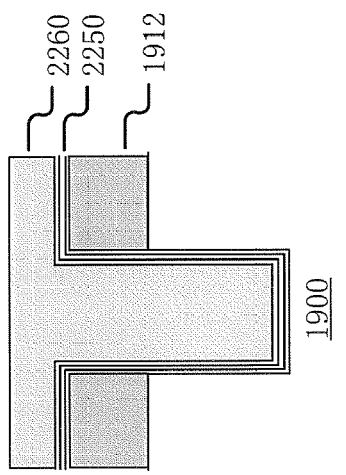
Figure 22A:
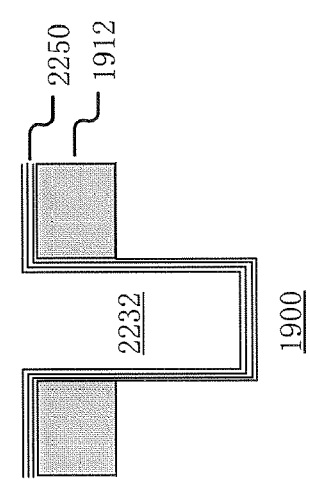
Figure 22F:
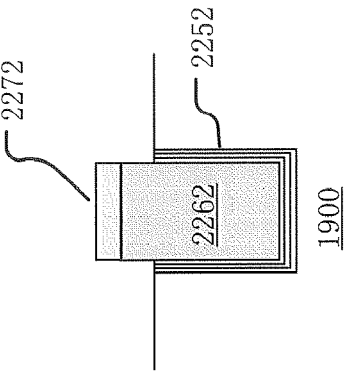
Figure 22E:
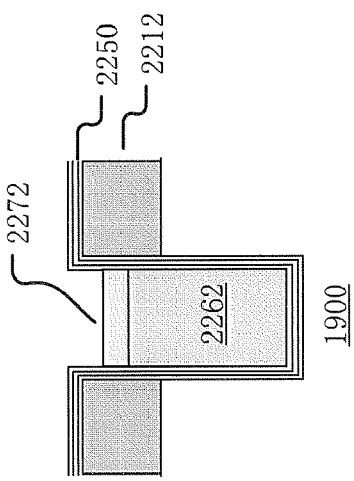
Figure 22D:
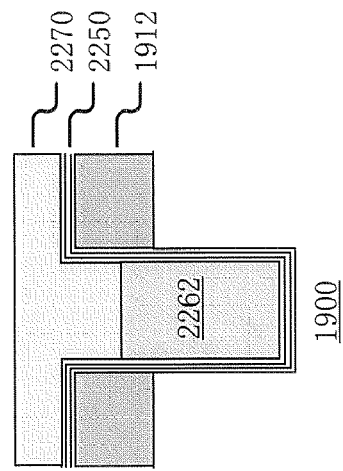
Figure 22I:
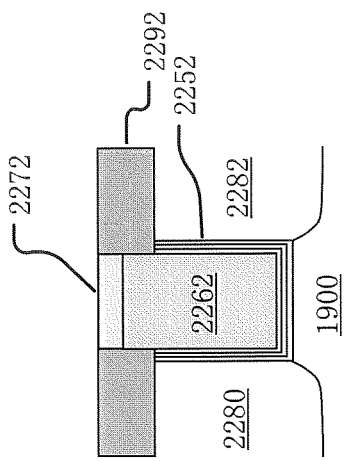
Figure 22H:
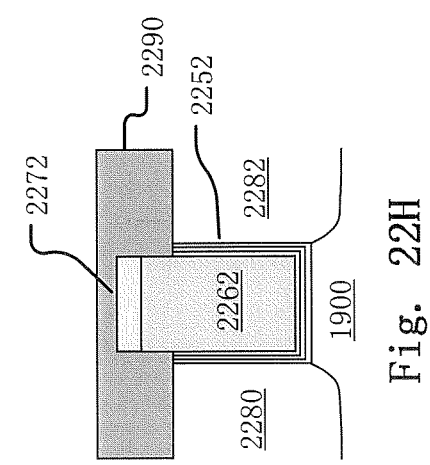
Figure 22K:
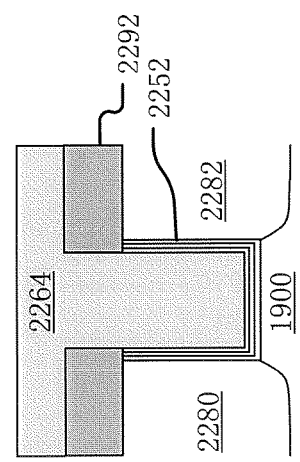
Figure 22G:
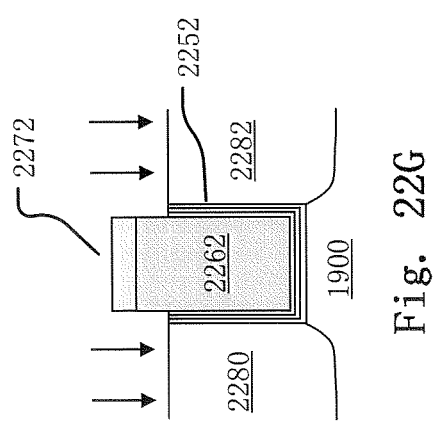
Figure 22J:
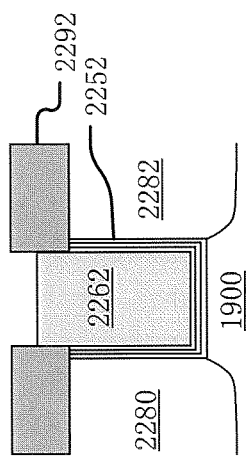

FIGS. 22A to 22K are ending process steps to form a NOR array of nonvolatile memory cells each in a recess, such that each nonvolatile memory cell has a recessed channel, following FIG. 19, 20, or 21. In FIG. 22A, dielectric and charge storage structures 2250, such as ONO layers, are formed in the recess, leaving a smaller recess 2232. In FIG. 22B, gate material 2260 is deposited, such as polysilicon. In FIG. 22C, the gate material is etched, leaving gate material 2262 inside the recess. In FIG. 22D, a dielectric 2270 such as SiN is deposited on the gate material 2262. In FIG. 22E, the dielectric is etched, leaving dielectric 2272 inside the recess. In FIG. 22F, the remaining patterned oxide is removed. At this point, the stack of gate material 2262 and oxide 2272 rise above the surface of the substrate. In FIG. 22G, ion implantation forms the source region 2280 and the drain region 2282. In FIG. 22H, oxide 2290, such as HDP oxide, is deposited. In FIG. 22I, excess oxide covering the oxide 2272 is removed, such as by CMP, dip-back, or etch-back. In FIG. 22J, oxide 2272 is removed. In FIG. 22K, additional gate material is deposited, forming gate region 2264.

Figure 23A:
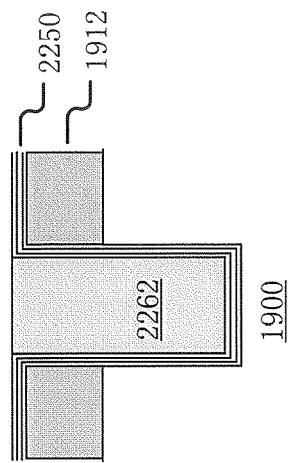
FIGS. 23A to 23E are ending process steps to form a NAND array of nonvolatile memory cells each in a recess, such that each nonvolatile memory cell has a recessed channel, following FIG. 19, 20, or 21.
Figure 23B:
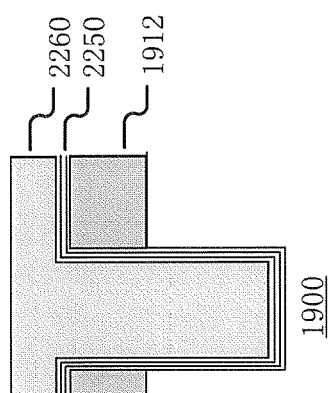
Figure 23C:
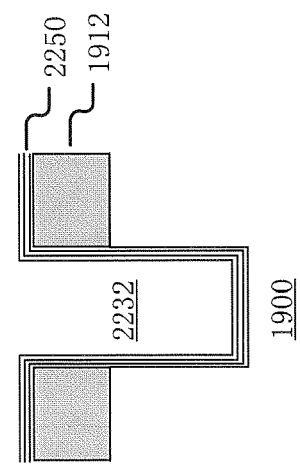
Figure 23D:
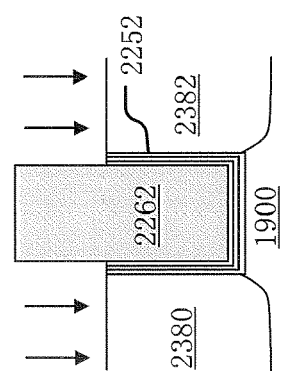
Figure 23E:
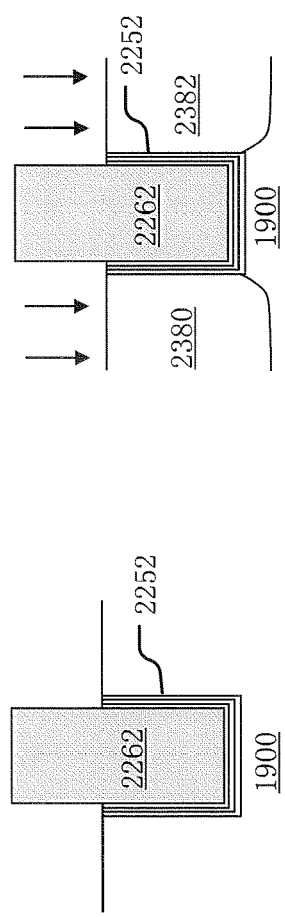

FIGS. 23A to 23E are ending process steps to form a NAND array of nonvolatile memory cells each in a recess, such that each nonvolatile memory cell has a recessed channel, following FIG. 19, 20, or 21. In FIG. 23A, dielectric and charge storage structures 2250, such as ONO layers, are formed in the recess, leaving a smaller recess 2232. In FIG. 23B, gate material 2260 is deposited, such as polysilicon. In FIG. 23C, excess gate material is removed, such as by CMP, to expose the ONO layers. In FIG. 23D, the remaining patterned oxide is removed. At this point, the gate material 2262 rises above the surface of the substrate. In FIG. 23E, ion implantation forms the source region 2380 and the drain region 2382.

Figure 24C:
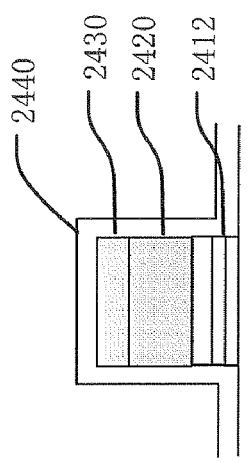
FIGS. 24A to 24D are beginning process steps to form raised source and drain regions of a nonvolatile memory cell in a NOR array, preceding FIG. 25 or 26.
Figure 24B:
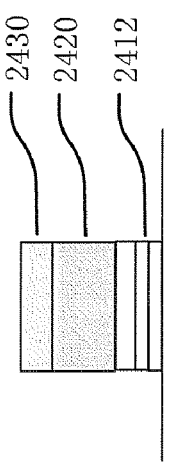
Figure 24A:
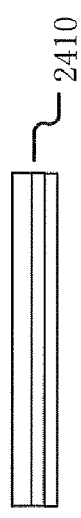
Figure 24D:
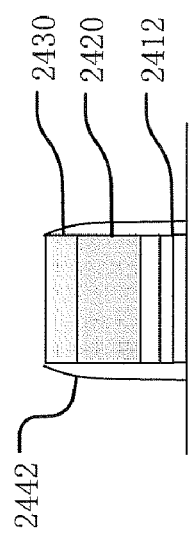

FIGS. 24A to 24D are beginning process steps to form raised source and drain regions of a nonvolatile memory cell in a NOR array, preceding FIG. 25 or 26. In FIG. 24A, dielectric and charge storage structures 2410, such as ONO layers, are deposited on the substrate 2400. In FIG. 24B, gate material such as polysilicon is deposited, oxide material such as SiN is deposited on the gate material, and photolithographic structures are formed, leaving a stack of SiN 2430, polysilicon 2420, and ONO 2412. In FIG. 24C, a spacer 2440 is formed. In FIG. 24D, the spacer is etched, leaving spacer sidewalls 2442.

Figure 25B:
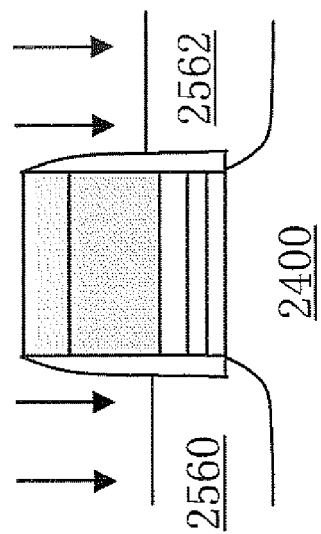
FIGS. 25A to 25B are ending process steps using epitaxial silicon to form raised source and drain regions of a nonvolatile memory cell in a NOR array, following FIG. 24 and preceding FIG. 27.
Figure 25A:
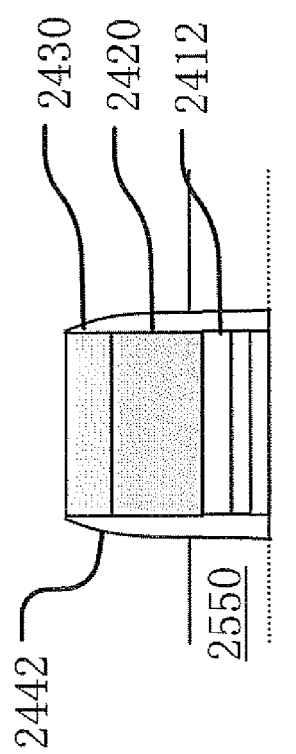

FIGS. 25A to 25B are ending process steps using epitaxial silicon to form raised source and drain regions of a nonvolatile memory cell in a NOR array, following FIG. 24 and preceding FIG. 27. In FIG. 25A, epitaxial silicon 2550 is deposited. In FIG. 25B, ion implantation forms the source region 2560 and the drain region 2562.

FIGS. 26A to 26C are ending process steps using polysilicon to form raised source and drain regions of a nonvolatile memory cell in a NOR array, following FIG. 24 and preceding FIG. 27. In FIG. 26A, polysilicon 2650 is deposited. In FIG. 26B, the polysilicon is etched back to leave polysilicon 2652. In FIG. 26C, ion implantation forms the source region 2660 and the drain region 2662.

FIGS. 27A to 27D are ending process steps to form a NOR array of nonvolatile memory cells each having raised source and drain regions, preceding FIG. 25 or 26. In FIG. 27A, dielectric, such as HDP oxide, is deposited, covering the structure including the spacer sidewalls and the oxide 2430. In FIG. 27B, excess oxide covering the oxide 2430 is removed, such as by CMP, dip-back, or etch-back, leaving oxide 2772 surrounding the spacer sidewalls. In FIG. 27C, oxide 2430 is removed. In FIG. 27D, additional gate material is deposited, forming gate region 2722.

Figure 28C:
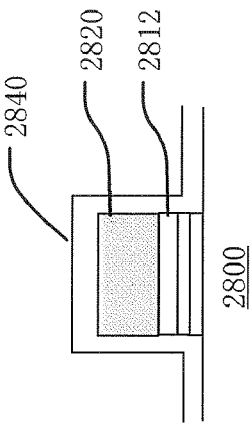
FIGS. 28A to 28D are beginning process steps to form a NAND array of nonvolatile memory cells each having raised source and drain regions, preceding FIG. 29 or 30.
Figure 28B:
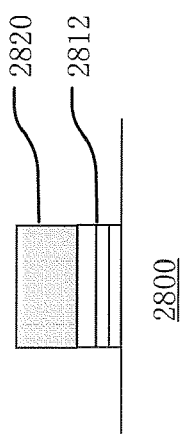
Figure 28A:
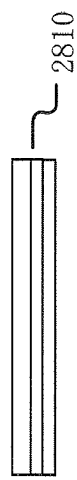
Figure 28D:
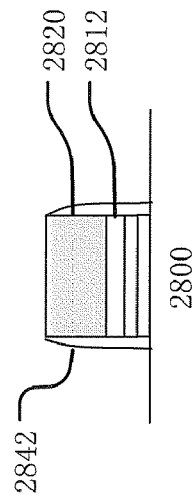

FIGS. 28A to 28D are beginning process steps to form a NAND array of nonvolatile memory cells each having raised source and drain regions, preceding FIG. 29 or 30. In FIG. 28A, dielectric and charge storage structures 2810, such as ONO layers, are deposited on the substrate 2800. In FIG. 28B, gate material such as polysilicon is deposited, and photolithographic structures are formed, leaving a stack of polysilicon 2820, and ONO 2812. In FIG. 28C, a spacer 2840 is formed. In FIG. 28D, the spacer is etched, leaving spacer sidewalls 2842.

Figure 29B:
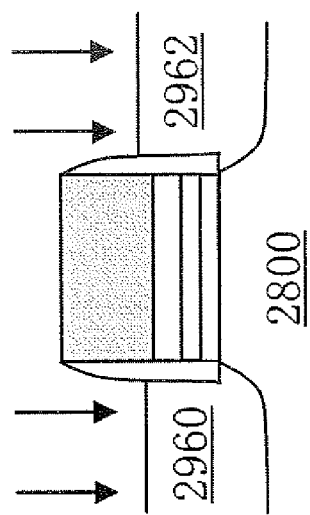
FIGS. 29A to 29B are ending process steps using epitaxial silicon to form a NAND array of nonvolatile memory cells each having raised source and drain regions, following FIG. 28.
Figure 29A:
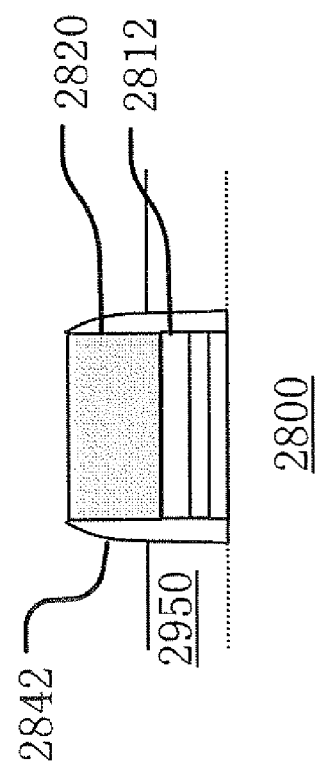

FIGS. 29A to 29B are ending process steps using epitaxial silicon to form a NAND array of nonvolatile memory cells each having raised source and drain regions, following FIG. 28. In FIG. 29A, epitaxial silicon 2950 is deposited. In FIG. 29B, ion implantation forms the source region 2960 and the drain region 2962.

FIGS. 30A to 30C are ending process steps using polysilicon to form a NAND array of nonvolatile memory cells each having raised source and drain regions, following FIG. 28. FIGS. 30A to 30C are ending process steps using polysilicon to form raised source and drain regions of a nonvolatile memory cell in a NOR array, following FIG. 24 and preceding FIG. 27. In FIG. 30A, polysilicon 3050 is deposited. In FIG. 30B, the polysilicon is etched back to leave polysilicon 3052. In FIG. 30C, ion implantation forms the source region 3060 and the drain region 3062.

Figure 31:
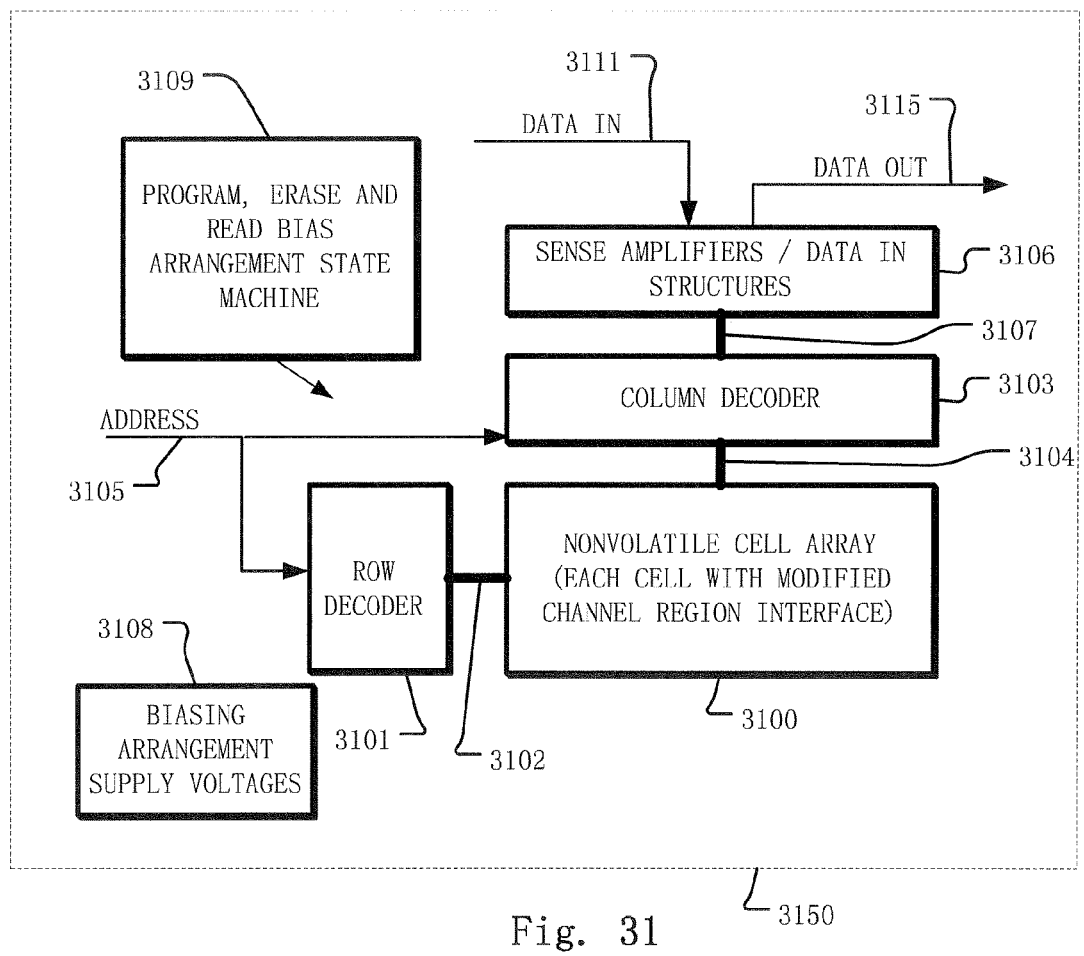
FIG. 31 is a block diagram of an exemplary nonvolatile memory integrated circuit with a modified channel region interface as disclosed herein.

FIG. 31 is a block diagram of an exemplary nonvolatile memory integrated circuit with a modified channel region interface as disclosed herein.

The integrated circuit 3150 includes a memory array 3100 of nonvolatile memory cells, on a semiconductor substrate. Each memory cells of array 3100 has a modified channel region interface, such as a recessed channel region, or raised source and drain regions. The memory cells of array 3100 may be individual cells, interconnected in arrays, or interconnected in multiple arrays. A row decoder 3101 is coupled to a plurality of word lines 3102 arranged along rows in the memory array 3100. A column decoder 3103 is coupled to a plurality of bit lines 3104 arranged along columns in the memory array 3100. Addresses are supplied on bus 3105 to column decoder 3103 and row decoder 3101. Sense amplifier and data-in structures 3106 are coupled to the column decoder 3103 via data bus 3107. Data is supplied via the data-in line 3111 from input/output ports on the integrated circuit 3150, or from other data sources internal or external to the integrated circuit 3150, to the data-in structures in block 3106. Data is supplied via the data-out line 3115 from the sense amplifiers in block 3106 to input/output ports on the integrated circuit 3150, or to other data destinations internal or external to the integrated circuit 3150. A bias arrangement state machine 3109 controls the application of bias arrangement supply voltages 3108, such as for the erase verify and program verify voltages, and the arrangements for programming, erasing, and reading the memory cells.

FIG. 32 is a diagram of a nonvolatile memory cell with a recessed channel between the source and drain regions, whereby the lower dielectric structure has a tri-layer thin ONO structure. The structure resembles the nonvolatile memory cell of FIG. 1, but the dielectric structure 108 (between the charge storage structure 108 and the channel region 114) is replaced with tri-layer thin ONO structure 3208. The ONO structure 3208 has a small hole tunneling barrier, such as less than or equal to about 4.5 eV, or more preferably less than or equal to about 1.9 eV. Approximate exemplary thickness ranges of the ONO structure 3208 are as follows. For the lower oxide, <20 angstroms, 5-20 angstroms, or <15 angstroms. For the middle nitride, <20 angstroms or 10-20 angstroms. For the upper oxide, <20 angstroms or 15-20 angstroms. Some embodiments of the memory cell of FIG. 32 are referred to as SONONOS or as bandgap engineered (BE)-SONOS. Additional details of various embodiments of the tri-layer thin ONO structure 3208 are disclosed in U.S. application Ser. No. 11/324,540, which is incorporated herein by reference.

FIG. 33 is a diagram of a nonvolatile memory cell with source and drain regions raised from the semiconductor substrate, whereby the lower dielectric structure has a tri-layer thin ONO structure 3208.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory cell integrated circuit, comprising:
   a nonvolatile memory array including a plurality of columns, each column of the plurality of columns including a plurality of nonvolatile memory cells arranged in a series, such that a subset of nonvolatile memory cells in the series are electrically connected to a bit line via other nonvolatile memory cells in the series, each nonvolatile memory cell of the array including:
      a charge storage structure storing charge to control a logical state stored by the nonvolatile memory cell integrated circuit;
      source and drain regions separated by a channel region;
      one or more dielectric structures at least partly between the charge storage structure and the channel region and at least partly between the charge storage structure and a source of gate voltage,
      wherein, for each nonvolatile memory cell of the array, an interface separates part of the one or more dielectric structures from the channel region, and a first end of the interface ends at an intermediate part of the source region and a second end of the interface ends at an intermediate part of the drain region.

2. The circuit of claim 1,
   wherein the first end of the interface ends at the intermediate part of the source region and the second end of the interface ends at the intermediate part of the drain region, due to the channel region being recessed into a substrate of the nonvolatile memory cell integrated circuit.

3. The circuit of claim 1, further comprising:
   a gate length scaling dielectric layer at least partly between a substrate and the one or more dielectric structures.

4. The circuit of claim 1, wherein the charge storage structure stores one bit.

5. The circuit of claim 1, wherein the charge storage structure stores multiple bits.

6. The circuit of claim 1, wherein the charge storage structure is a charge trapping structure.

7. The circuit of claim 1, wherein the charge storage structure is a nanocrystal structure.

8. The circuit of claim 1, wherein said dielectric structure at least partly between the charge trapping structure and the channel region includes:
   a bottom silicon oxide layer;
   a middle silicon nitride layer on the bottom silicon oxide layer; and
   a top silicon oxide layer on the middle silicon nitride layer.

9. The circuit of claim 8, wherein the bottom silicon oxide layer has a thickness less than about 20 Angstroms.

10. The circuit of claim 8, wherein the middle silicon nitride layer has a thickness less than about 20 Angstroms.

11. The circuit of claim 8, wherein the top silicon oxide layer has a thickness less than about 20 Angstroms.

12. The circuit of claim 8, wherein the bottom silicon oxide layer has a thickness of about 5 to 20 Angstroms.

13. The circuit of claim 8, wherein the middle silicon nitride layer has a thickness of about 10 to 20 Angstroms.

14. The circuit of claim 8, wherein the top silicon oxide layer has a thickness of about 15 to 20 Angstroms.

15. The circuit of claim 8, wherein the bottom silicon oxide layer has a thickness less than about 15 Angstroms.

* * * * *